(12) United States Patent
Fukuura

(10) Patent No.: US 9,693,423 B2
(45) Date of Patent: *Jun. 27, 2017

(54) METAL-BASED PARTICLE ASSEMBLY

(75) Inventor: Tomohiro Fukuura, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/007,107

(22) PCT Filed: Mar. 30, 2012

(86) PCT No.: PCT/JP2012/058597
§ 371 (c)(1),
(2), (4) Date: Sep. 24, 2013

(87) PCT Pub. No.: WO2012/133776
PCT Pub. Date: Oct. 4, 2012

(65) Prior Publication Data
US 2014/0037977 A1 Feb. 6, 2014

(30) Foreign Application Priority Data

Mar. 31, 2011 (JP) ................................. 2011-079474
Nov. 9, 2011 (JP) ................................. 2011-245335
Jan. 31, 2012 (JP) ................................. 2012-018645

(51) Int. Cl.
*B32B 15/16* (2006.01)
*H05B 33/24* (2006.01)
(Continued)

(52) U.S. Cl.
CPC ........... *H05B 33/24* (2013.01); *B22F 1/0018* (2013.01); *B22F 1/0096* (2013.01); *B82Y 20/00* (2013.01);
(Continued)

(58) Field of Classification Search
None
See application file for complete search history.

(56) References Cited

U.S. PATENT DOCUMENTS 5,866,433 A * 2/1999 Schalkhammer et al. ..... 436/525
6,074,575 A 6/2000 Sugioka et al.
(Continued)

FOREIGN PATENT DOCUMENTS

CN        1527648 A    9/2004
CN     101728486 A    6/2010
(Continued)

OTHER PUBLICATIONS

Fukuura et al., May 23, 2009, "Long Range Enhancement of Molecular Fluorescence by Closely Packed Submicro-scale Ag Islands", e-Joural of Surface Science and Nanotechnology, vol. 7, pp. 653-659.*

(Continued)

*Primary Examiner* — Seth Dumbris
(74) *Attorney, Agent, or Firm* — Sughrue Mion, PLLC

(57) ABSTRACT

There is provided a metal-based particle assembly comprising 30 or more metal-based particles separated from each other and disposed in two dimensions, the metal-based particles having an average particle diameter in a range of from 200 to 1600 nm, an average height in a range of from 55 to 500 nm, and an aspect ratio, as defined by a ratio of the average particle diameter to the average height, in a range of from 1 to 8, wherein the metal-based particles are disposed such that an average distance between adjacent metal-based particles may be in a range of from 1 to 150 nm. This metal-based particle assembly presents significantly intense plasmon resonance and also allows plasmon resonance to have an effect over a range extended to a significantly large distance.

6 Claims, 9 Drawing Sheets

(51) Int. Cl.
*B22F 1/00* (2006.01)
*B82Y 20/00* (2011.01)
*G02B 5/00* (2006.01)
*H01L 51/52* (2006.01)
*B82Y 30/00* (2011.01)

(52) U.S. Cl.
CPC .......... *G02B 5/008* (2013.01); *H01L 51/5262* (2013.01); *B82Y 30/00* (2013.01); *C08G 2261/3142* (2013.01); *C08G 2261/3223* (2013.01); *C08G 2261/3246* (2013.01); *C08G 2261/3422* (2013.01); *C08G 2261/95* (2013.01); *H01L 51/5203* (2013.01); *Y10T 428/12153* (2015.01); *Y10T 428/24975* (2015.01); *Y10T 428/256* (2015.01)

(56) References Cited

U.S. PATENT DOCUMENTS

| | | | |
|---|---|---|---|
| 7,705,989 B2* | 4/2010 | Chaton et al. | 356/445 |
| 2004/0089339 A1 | 5/2004 | Kukulka et al. | |
| 2005/0088078 A1 | 4/2005 | Tseng et al. | |
| 2005/0164169 A1 | 7/2005 | Malak | |
| 2006/0032529 A1 | 2/2006 | Rand et al. | |
| 2006/0263593 A1 | 11/2006 | Aziz et al. | |
| 2006/0279738 A1 | 12/2006 | Ogawa et al. | |
| 2007/0114523 A1 | 5/2007 | Oumi et al. | |
| 2007/0115474 A1 | 5/2007 | Chaton et al. | |
| 2007/0295381 A1 | 12/2007 | Fujii et al. | |
| 2008/0007852 A1 | 1/2008 | Kawasaki | |
| 2008/0078678 A1 | 4/2008 | Fujimoto et al. | |
| 2008/0135739 A1 | 6/2008 | Kim et al. | |
| 2008/0206565 A1 | 8/2008 | Takahashi et al. | |
| 2008/0278063 A1 | 11/2008 | Cok | |
| 2009/0008735 A1 | 1/2009 | Ogino et al. | |
| 2009/0021137 A1 | 1/2009 | Sugiura et al. | |
| 2009/0079988 A1 | 3/2009 | Narahara et al. | |
| 2009/0122310 A1* | 5/2009 | Zhang et al. | 356/301 |
| 2009/0213368 A1 | 8/2009 | Roper et al. | |
| 2009/0257062 A1* | 10/2009 | Rubinstein et al. | 356/445 |
| 2010/0012189 A1 | 1/2010 | Sakai et al. | |
| 2010/0022020 A1* | 1/2010 | Halas et al. | 436/171 |
| 2010/0046077 A1 | 2/2010 | Lee et al. | |
| 2010/0126567 A1 | 5/2010 | Kaufman | |
| 2010/0149540 A1* | 6/2010 | Boukherroub et al. | 356/445 |
| 2010/0309539 A1* | 12/2010 | Kaye et al. | 359/288 |
| 2011/0024779 A1 | 2/2011 | Nakamura et al. | |
| 2011/0062481 A1 | 3/2011 | Oyamada | |
| 2011/0267614 A1* | 11/2011 | Reinhard | B82Y 30/00 356/301 |
| 2012/0025185 A1 | 2/2012 | Kasamatsu | |
| 2012/0032530 A1 | 2/2012 | Hyde et al. | |
| 2012/0043532 A1 | 2/2012 | Yasuda et al. | |
| 2012/0325301 A1 | 12/2012 | Misawa et al. | |
| 2013/0081683 A1 | 4/2013 | Masunaga et al. | |
| 2013/0213477 A1 | 8/2013 | Nakayama et al. | |
| 2014/0008636 A1 | 1/2014 | Fukuura | |
| 2014/0011043 A1 | 1/2014 | Fukuura | |
| 2014/0017507 A1 | 1/2014 | Fukuura | |
| 2014/0037977 A1 | 2/2014 | Fukuura | |

FOREIGN PATENT DOCUMENTS

| | | |
|---|---|---|
| CN | 101790899 A | 7/2010 |
| EP | 2203030 A1 | 6/2010 |
| EP | 2217913 A1 | 8/2010 |
| EP | 2693844 A1 | 2/2014 |
| EP | 2693845 A1 | 2/2014 |
| EP | 2693846 A1 | 2/2014 |
| JP | 08-134440 A | 5/1996 |
| JP | 8-271431 A | 10/1996 |
| JP | 2004-235140 A | 8/2004 |
| JP | 2006332046 A | 12/2006 |
| JP | 2007-17432 A | 1/2007 |
| JP | 2007-501391 A | 1/2007 |
| JP | 2007-139540 A | 6/2007 |
| JP | 2007-165284 A | 6/2007 |
| JP | 2007-335222 A | 12/2007 |
| JP | 2008080461 A | 4/2008 |
| JP | 2008510305 A | 4/2008 |
| JP | 2008-214363 A | 9/2008 |
| JP | 2008-243669 A | 10/2008 |
| JP | 2010/113469 A1 | 10/2008 |
| JP | 2009038352 A | 2/2009 |
| JP | 2009-74947 A | 4/2009 |
| JP | 201023675 A | 6/2010 |
| JP | 2010198830 A | 9/2010 |
| JP | 2010-238406 A | 10/2010 |
| JP | 2010-238775 A | 10/2010 |
| JP | 2013-110395 A | 6/2013 |
| WO | 2005/017570 A2 | 2/2005 |
| WO | 2005/033335 A2 | 4/2005 |
| WO | 2006/085515 A1 | 8/2006 |
| WO | 2008/082569 A1 | 7/2008 |
| WO | 2009/064565 A1 | 5/2009 |
| WO | 2009141903 A1 | 11/2009 |
| WO | 2011/027830 A1 | 3/2011 |
| WO | 2011/125101 A1 | 10/2011 |
| WO | 2012/042831 A1 | 4/2012 |
| WO | 2012/133778 A1 | 4/2012 |
| WO | 2012/133776 A1 | 10/2012 |
| WO | 2012/133777 A1 | 10/2012 |
| WO | 2012/133778 A1 | 10/2012 |
| WO | 2012/133779 A1 | 10/2012 |

OTHER PUBLICATIONS

Yang et al., Jul. 13, 2010, "Engineering Nanoparticle Cluster Arrays for Bacterial Biosensing: The Role of the Building Block in Multiscale SERS Substrates", Adv. Funct. Mater., vol. 20, pp. 2619-2628.*
Tomohiro Fukuura et al., "Long Range Enhancement of Molecular Fluorescence by Closely Packed Submicro-scale Ag Islands", e-Journal of Surface Science and Nanotechnology, 2009, pp. 653-659, vol. 7.
K. Lance Kelly et al., "The Optical Properties of Metal Nanoparticles: The Influence, Size, Shape, and Dielectric Environment", J. Phys. Chem. B 2003, pp. 668-677, vol. 107.
European Search Report in Application No. EP 12 76 5934 dated Oct. 10, 2014.
W. Li, S. Pan and L. J. Rothberg, "Emissive Efficiency Enhancement of Alq3 and Prospects for Plasmon-enhanced Organic Electroluminescence" in Plasmonics: Metallic Nanostructures and Their Optical Properties VI, edited by Mark I. Stockman; Proc. of SPIE, vol. 7032, pp. 703224-1-703224-7 (2008).
George Chumanov et al., "Unusual Extinction Spectra of Nanometer-Sized Silver Particles Arranged in Two-Dimensional Arrays," J. Phys. Chem., 1996, pp. 5166-5168, vol. 100.
International Search Report of PCT/JP2013/057007 dated Apr. 16, 2013.
Jiha Sung et al., "Nanoparticle Spectroscopy: Plasmon Coupling in Finite-Sized Two-Dimensional Arrays of Cylindrical Silver Nanoparticles," J. Phys. Chem. C, 2008, pp. 4091-4096, vol. 112.
Society of Powder Technology, "Particle Measurement Technique," Nikkan Kogyo Shimbun, Ltd., Nov. 30, 1994, pp. 5-8.
Julie S. Biteen, et al., "Plasmon-Enhanced Photoluminescence of Silicon Quantum Dots: Simulation and Experiment", J. Phys. Chem. C, 2007, pp. 13372-13377, vol. 111, No. 36.
Wen Liu, "Surface plasmon enhanced GaAs thin film solar cells", Solar Energy Materials & Solar Cells, 2011, pp. 693-698, vol. 95.
Extended European Search Report issued Aug. 19, 2014 in counterpart European Patent Application No. 12764739.4.
International Search Report for PCT/JP2012/077095 dated Nov. 20, 2012.
Office Action issued on Jun. 3, 2015 in Chinese patent application No. 201280016534.2 with English translation.
International Search Report for PCT/JP2012/058600 dated Jun. 5, 2012.

(56) References Cited

OTHER PUBLICATIONS

International Search Report for JP/2012/075059 dated Dec. 25, 2012.
International Search Report for JP/2012/058597 dated Jun. 5, 2012.
Office Action issued on Mar. 17, 2014 in U.S. Appl. No. 14/007,113.
Communication dated Jul. 15, 2015 from the State Intellectual Property Office of People's Republic of China in Application No. 201280051976.0.
Communication dated Jul. 17, 2015 from the State Intellectual Property Office of People's Republic of China in Application No. 201280016444.3.
Jiha Sung et al., "Nanoparlicle Spectroscopy: Plasmon Coupling in Finite-Sized Two-Dimensional Arrays of Cylindrical Silver Nanoparticles," J. Phys. Chem. C, 2008, pp. 4091-4096, vol. 112.
Extended European Search Report issued Aug. 18, 2014 in counterpart European Patent Application No. 12764739.4.
D. Duche et al., "Improving light absorption in organic solar cells by plasmonic contribution", Elsevier, Solar Energy Materials & Solar Cells, vol. 93, (2009), pp. 1377-1382.
Communication dated Aug. 11, 2015 from the European Patent Office in European Application No. 12844347.0.
Communication dated Sep. 21, 2015, issued by the Taiwan Intellectual Property Office in corresponding Taiwanese Application No. 101111532.
Communication dated Nov. 16, 2015 from the U.S. Appl. No. 14/007,113.
Fukuura, T. et al., "Long Range Enhancement of Molecular Fluorescence by Closely Packed Submicro-scale Ag Islands", e-Journal of Surface Science and Nanotechnology, vol. 7 (2009), pp. 653-659, published May 23, 2009.
Communication dated Dec. 15, 2015 from the Japanese Patent Office in application No. 2012-071680.
Communication dated Jan. 28, 2016 from the State Intellectual Property Office of the P.R.C. issued in corresponding Application No. 201280016534.2.
Communication dated Mar. 1, 2016, issued by the Japan patent Office in counterpart Japanese Application No. 2012-071677.
Communication dated Apr. 22, 2016 from the State Intellectual Property Office of the P.R.C. in counterpart application No. 201280051976.0.
Communication dated Apr. 11, 2016 from the Taiwanese Intellectual Property Office in counterpart application No. 101111532.
Communication dated Apr. 20, 2016 from the U.S. Patent and Trademark Office in counterpart U.S. Appl. No. 14/007,113.
Ghorbani et al., "Synthesis of ZnO Nanoparticles by Precipitation Method," Oriental Journal of Chemistry, 2015, vol. 31, No. 2, pp. 1219-1221.
International Preliminary Report on Patentability dated Oct. 1, 2013 from the International Bureau in counterpart International Application No. PCT/JP2012/058599.
International Search Report and Written Opinion dated Jun. 5, 2012 from the Intenational Searching Authority in counterpart International Application No. PCT/JP2012/058599.
Communication dated Apr. 27, 2016 from the Taiwanese Intellectual Property Office in counterpart application No. 101111528.
Communication dated Oct. 20, 2014 from the European Patent Office in counterpart application No. 12764351.8.
Communication dated Jun. 1, 2015 from the State Intellectual Property Office of the P.R.C. in counterpart application No. 201280015771.7.
Communication dated Aug. 7, 2015 from the Taiwanese Intellectual Property Office in counterpart application No. 101111527.
Communication dated Jan. 5, 2016 from the Japanese Patent Office in counterpart application No. 2012-071679.
Communication dated Jan. 21, 2016 from the State Intellectual Property Office of the P.R.C. in counterpart application No. 201280015771.7.
Communication dated May 20, 2016 from the U.S. Patent and Trademark Office in counterpart U.S. Appl. No. 14/007,504.
Communication dated Dec. 11, 2015 from the Taiwanese Intellectual Property Office issued in corresponding Application No. 101111528.
Non-Final Office Action issued Apr. 9, 2015 in U.S. Appl. No. 14/007,504 to Tomohiro Fukuura, filed Sep. 25, 2013.
Final Office Action issued Oct. 13, 2015 in U.S. Appl. No. 14/007,504 to Tomohiro Fukuura, filed Sep. 25, 2013.
Advisory Action issued Mar. 2, 2016 in U.S. Appl. No. 14/007,504 to Tomohiro Fukuura, filed Sep. 25, 2013.
Office Action issued Apr. 13, 2016 in counterpart Taiwanese application No. 101111527 with English translation.
Communication dated May 20, 2016, issued by the Taiwanese Patent Office in counterpart application No. 101139550.
Communication dated Jul. 5, 2016, issued by the Japanese Patent Office in counterpart application No. 2012-230445.
International Preliminary Report dated Oct. 1, 2013, issued by the International Bureau in counterpart application No. PCT/JP2012/058598.
International Search Report dated Jun. 5, 2012, issued by the International Bureau in counterpart application No. PCT/JP2012/058598.
Written Opinion dated Jun. 5, 2012, issued by the International Bureau in counterpart application No. PCT/JP2012/058598.
Communication dated Jan. 25, 2016, issued by the State Intellectual Property Office in counterpart application No. 201280016046.1.
Communication dated Feb. 16, 2016, issued by the Japanese Patent Office in counterpart application No. 2012-071678.
Communication dated Jun. 3, 2015, issued by the State Intellectual Property Office in counterpart application No. 201280016046.1.
Communication dated Nov. 7, 2014, issued by the European Patent Office in counterpart application No. 12763034.1.
Communication dated Apr. 8, 2015, issued by the U.S. Patent and Trademark Office in counterpart U.S. Appl. No. 14/007,523.
Communication dated Oct. 7, 2015, issued by the U.S. Patent and Trademark Office in counterpart U.S. Appl. No. 14/007,523.
Communication dated Feb. 23, 2016, issued by the U.S. Patent and Trademark Office in counterpart U.S. Appl. No. 14/007,523.
Communication dated May 25, 2016, issued by the U.S. Patent and Trademark Office in counterpart U.S. Appl. No. 14/007,523.
Communication dated Aug. 5, 2016, issued by the U.S. Patent and Trademark Office in corresponding U.S. Appl. No. 14/352,885.
Communication dated Jul. 21, 2016, issued by the State Intellectual Property Office of the P.R.C. in corresponding Chinese Application No. 201280016534.2.
Communication dated Sep. 12, 2016, issued by the U.S. Patent and Trademark Office in corresponding U.S. Appl. No. 14/007,504.
Communication dated Sep. 13, 2016, issued by the U.S. Patent and Trademark Office in U.S. Appl. No. 14/007,523.
"What's Mica," OKABE MICA Co., LTD.; http://www.okabe-mica.co.jp/mica.html [retrieved Aug. 26, 2016] 5 pages total.
Communication dated Sep. 6, 2016 from the Japanese Patent Office in counterpart application No. 2012-071679.
Communication dated Sep. 20, 2016 from the Japanese Patent Office in counterpart application No. 2012-071678.
Communication dated Sep. 20, 2016 from the Japanese Patent Office in counterpart application No. 2014-507649.
Dijken et al., "The Kinetics of the Radiative and Nonradiative Processes in Nanocrystalline ZnO Particles upon Photoexcitation," J. Phys. Chem. B (2000) vol. 104; pp. 1715-1723.
Wong et al., " Influence of Organic Capping Ligands on the Growth Kinetics of ZnO Nanoparticles," Langmuir (2001) vol. 17; pp. 8362-8367.
Nakayama et al., "Optical Assessment of Semiconductor Crystal—Observing a Crystal through an Optical Spectrum," The Japan Society of Applied Physics, Division of Crystals Science and Technology, the $10^{th}$ Crystals Science and Technology Seminar Text on Nov. 14, 2005; pp. 1-24.
Communication dated Oct. 26, 2016 from the Taiwanese Intellectual Property Office in counterpart application No. 101111527.
Office Action issued Dec. 27, 2016 in counterpart Chinese Patent Application No. 201280016534.2 with English translation.
Office Action issued Dec. 30, 2016 in counterpart U.S. Appl. No. 14/007,113 to Tomohiro Fukuura.

(56) References Cited

OTHER PUBLICATIONS

Office Action issued Jan. 5, 2017 in counterpart European Patent Application No. 12 764 351.8.
Office Action issued Jan. 5, 2017 in counterpart European Patent Application No. 12 763 034.1.
Office Action issued Jan. 5, 2017 in counterpart European Patent Application No. 12 765 934.0.
Office Action issued Dec. 12, 2016 in counterpart Chinese Patent Application No. 201280051976.0 with English translation.
Office Action issued Feb. 16, 2017 in U.S. Appl. No. 14/352,885 to Fukuura.
Notice of Grounds of Rejection issued Feb. 7, 2017 in Japanese Patent Application No. 2012-230445 with English translation.
First Office Action issued Mar. 1, 2017 in counterpart Chinese Patent Application No. 201610265246.0 with translation.
First Office Action issued Mar. 1, 2017 in counterpart Chinese Patent Application No. 201610266488.1 with translation.
Final Decision for Rejection issued May 9, 2017 in Japanese Patent Application No. 2014-507649 with English Translation.
Handbook of Applied Physics, 2nd Edition, published by Maruzen Kabushikikaisha on Apr. 25, 2002, Editor: Japan Society of Applied Physics, p. 437, with English Translation.

\* cited by examiner (a)

(b)

(a)

(b)

METAL-BASED PARTICLE ASSEMBLY

CROSS REFERENCE TO RELATED APPLICATIONS

This application is a National Stage of International Application No. PCT/JP2012/058597 filed Mar. 30, 2012, claiming priority based on Japanese Patent Application Nos. 2011-079474 filed Mar. 31, 2011, 2011-245335 filed Nov. 9, 2011, and 2012-018645 filed Jan. 31, 2012, the contents of all of which are incorporated herein by reference in their entirety.

TECHNICAL FIELD

The present invention relates to a metal-based particle assembly that is a plasmonic material useful for light emitting devices (organic electroluminescence (EL) devices, inorganic EL devices, inorganic light emitting diode (LED) devices, and the like) to provide improved luminous efficiency and for photoelectric conversion devices (solar cell devices) to provide improved conversion efficiency.

BACKGROUND ART

It has conventionally been known that making metal particles small to be nano-sized presents functions that are not observed when it is in a bulk state, and localized plasmon resonance is in particular expected for application. Plasmon is a compressional wave of free electrons that arises by collective oscillation of the free electrons in a metallic nanostructure.

In recent years, a field of art handling the plasmon is referred to as plasmonics and attracts large attention, and has also been actively studied and such study includes exploiting phenomena of localized plasmon resonance of a metal nanoparticle to be intended for improvements of light emitting devices in luminous efficiency and improvements of photoelectric conversion devices (solar cell devices) in conversion efficiency.

Japanese Patent Laying-Open Nos. 2007-139540 (PTD 1) and 08-271431 (PTD 2) and WO2005/033335 (PTD 3), for example, disclose techniques exploiting localized plasmon resonance for enhanced fluorescence. Furthermore, T. Fukuura and M. Kawasaki, "Long Range Enhancement of Molecular Fluorescence by Closely Packed Submicro-scale Ag Islands", e-Journal of Surface Science and Nanotechnology, 2009, 7, 653 (NPD 1) indicates a study on localized plasmon resonance of silver nanoparticles.

CITATION LIST

Patent Documents

PTD 1: Japanese Patent Laying-Open No. 2007-139540
PTD 2: Japanese Patent Laying-Open No. 08-271431
PTD 3: WO2005/033335

Non Patent Document

NPD 1: T. Fukuura and M. Kawasaki, "Long Range Enhancement of Molecular Fluorescence by Closely Packed Submicro-scale Ag Islands", e-Journal of Surface Science and Nanotechnology, 2009, 7, 653

SUMMARY OF INVENTION

Technical Problem

Exploiting the metal nanoparticle's localized plasmon resonance to enhance emission, as conventional, is, however, accompanied by the following issue. More specifically, there are two factors for a metal nanoparticle to act to enhance emission: 1) an electric field near the metal nanoparticle is enhanced through the generation of localized plasmon in the particle (a first factor); and 2) energy transfer from a molecule excited excites an oscillation mode of a free electron in the metal nanoparticle, which causes a radiative induced dipole in the metal nanoparticle larger than a radiative dipole of the excited molecule, and luminescent quantum efficiency per se thus increases (a second factor). In order to effectively cause, in the metal nanoparticle, the radiative induced dipole that is involved in the second factor, which is a larger factor, it is required that the metal nanoparticle and the molecule to be excited (such as fluorescent material) have a distance therebetween within a range disallowing energy transfer which is a direct electron transfer based on the Dexter mechanism to occur but allowing energy transfer based on the Förster mechanism to occur (i.e., a range of 1 nm to 10 nm). This is because the radiative induced dipole is caused based on the theory of Förster's energy transfer (see NPD 1 above).

In general, within the range of 1 nm to 10 nm, the metal nanoparticle and the molecule to be excited with a smaller distance therebetween facilitate causing the radiative induced dipole and allow an increased emission enhancement effect, whereas the metal nanoparticle and the molecule to be excited with a larger distance therebetween result in ineffective localized plasmon resonance and hence a gradually reduced emission enhancement effect, and the metal nanoparticle and the molecule to be excited with a distance therebetween exceeding the range allowing the Förster mechanism to present energy transfer (i.e., approximately 10 nm or larger in general) failed to provide a substantial emission enhancement effect. PTDs 1-3 also describe emission enhancement methods with a distance of 10 nm or smaller between a metal nanoparticle and a molecule to be excited to obtain an effective emission enhancement effect.

Localized plasmon resonance via a conventional metal nanoparticle thus has such an essential issue that it has an effect in an extremely limited range of 10 nm or smaller from a surface of the metal nanoparticle. This issue necessarily invites such an issue that little improvement effects can be observed in attempts applying the localized plasmon resonance via the metal nanoparticle to a light emitting device, a photoelectric conversion device or the like aimed at improving luminous efficiency or conversion efficiency. More specifically, a light emitting device, a photoelectric conversion device and the like normally have an active layer (e.g., a light emitting layer for the light emitting device, a light-absorbing layer for the photoelectric conversion device, and the like) having the thickness of several tens nm or larger, and even if the metal nanoparticle can be disposed adjacent to or in the active layer, a direct enhancement effect via localized plasmon resonance can only be obtained at an extremely small portion of the active layer.

The present invention has been made in view of the above issue, and an object thereof is to provide a novel plasmonic material presenting significantly intense plasmon resonance and also allowing plasmon resonance to have an effect over a range extended to a significantly large distance.

Solution to Problem

PTD 1 (see paragraphs 0010-0011) provides a theoretical explanation of a relationship between emission enhancement through localized plasmon resonance and a metal nanoparticle's particle diameter, and according to this explanation, when a spherical silver particle having a particle diameter of approximately 500 nm is used, while luminous efficiency φ of approximately one is theoretically provided, in reality such a silver particle does not present a substantial effect to enhance emission. Such a large-size silver particle does not present a substantial effect to enhance emission because it is inferred that the silver particle has an excessively large number of surface free electrons therein, and accordingly, dipole-type localized plasmon observed in a typical nanoparticle (a nanoparticle having a relatively small particle diameter) is not easily generated. It is believed, however, that if a significantly large number of surface free electrons that the large-size nanoparticle has therein can be effectively excited as plasmon, the plasmon would be expected to contribute to drastically more effective enhancement.

As a result of a diligent study, the present inventor has found that a metal-based particle assembly formed of at least a specific number of large-size metal-based particles having a specific shape and disposed in two dimensions with a specific spacing therebetween can not only present significantly intense plasmon resonance but also allow plasmon resonance to have an effect over a significantly extended range (or a plasmonic enhancement effect to cover the range).

The present invention includes the following:

[1] A metal-based particle assembly comprising 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, wherein said metal-based particles are disposed such that an average distance between adjacent metal-based particles may be in a range of from 1 to 150 nm.

[2] The metal-based particle assembly according to item [1], wherein said metal-based particles are oblate particles with said aspect ratio of more than one.

[3] The metal-based particle assembly according to item [1] or [2], wherein said metal-based particles are made of silver.

[4] The metal-based particle assembly according to any one of items [1] to [3], wherein said metal-based particles are non-conductive between adjacent metal-based particles.

[5] A metal-based particle assembly film-layered substrate comprising: a substrate; and a film composed of the metal-based particle assembly according to any one of items [1] to [4] and layered on said substrate.

[6] The metal-based particle assembly film-layered substrate according to item [5], having in an absorption spectrum for a visible light region a maximum wavelength of a peak at a longest side in wavelength, the maximum wavelength being in a range of from 350 to 550 nm.

[7] The metal-based particle assembly film-layered substrate according to item [5] or [6], having in an absorption spectrum for a visible light region a maximum wavelength of a peak at a longest side in wavelength, an absorbance at the maximum wavelength being at least one.

[8] The metal-based particle assembly film-layered substrate according to any one of items [5] to [7], further comprising an insulating layer covering a surface of each metal-based particle that composes said film.

[9] An optical device comprising: a light-absorbing layer having the thickness of at least 10 nm; and the metal-based particle assembly according to any one of items [1] to [4] or the metal-based particle assembly film-layered substrate according to any one of items [5] to [8].

[10] An optical device comprising: a light-emitting layer having the thickness of at least 10 nm; and the metal-based particle assembly according to any one of items [1] to [4] or the metal-based particle assembly film-layered substrate according to any one of items [5] to [8].

In the present specification, a metal-based particle assembly layered on a substrate will be referred to as a metal-based particle assembly film-layered substrate. Furthermore, in the present specification, a light absorbing layer is a concept including a light absorbing layer that is an active layer of a photoelectric conversion device (a solar cell device), and a light emitting layer that is an active layer of a light emitting device, for example.

Advantageous Effect of Invention

The metal-based particle assembly and metal-based particle assembly film-layered substrate of the present invention, as compared with a conventional plasmonic material, present significantly intense plasmon resonance and also allow plasmon resonance to have an effect over a significantly extended range (or a plasmonic enhancement effect to cover the range). The metal-based particle assembly and metal-based particle assembly film-layered substrate of the present invention are significantly useful as an enhancement element for an optical device such as a light emitting device, a photoelectric conversion device (a solar cell device) or the like, and allow an optical device therewith to provide significant improvements of luminous efficiency or conversion efficiency.

DESCRIPTION OF EMBODIMENTS

Figure 1:
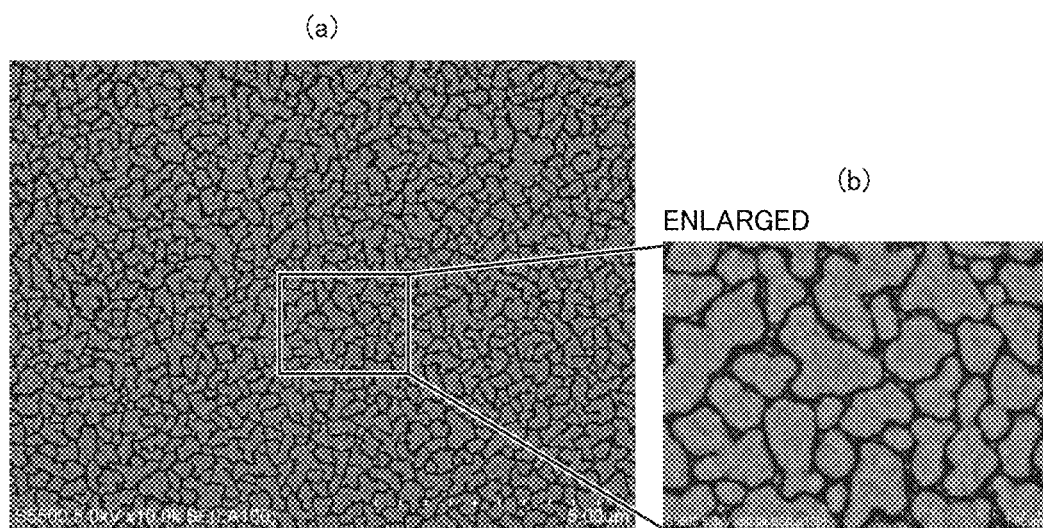
FIG. 1 shows SEM images (as scaled 10000 times and 50000 times) of a metal-based particle assembly film in a metal-based particle assembly film-layered substrate obtained in Example 1, as observed from directly above.

<Metal-Based Particle Assembly and Metal-Based Particle Assembly Film-Layered Substrate>

The metal-based particle assembly of the present invention is a particle assembly comprising 30 or more metal-based particles mutually separated and disposed in two dimensions. The metal-based particles that compose the metal-based particle assembly have an average particle diameter in a range of from 200 to 1600 nm, an average height in a range of from 55 to 500 nm, and an aspect ratio, as defined by a ratio of the average particle diameter to the average height, in a range of from 1 to 8. The metal-based particles that compose the assembly are disposed such that an average distance between adjacent metal-based particles may be in a range of from 1 to 150 nm. Furthermore, the metal-based particle assembly film-layered substrate of the present invention is a substrate having the above metal-based particle assembly layered (or carried) thereon.

As the metal-based particle assembly and metal-based particle assembly film-layered substrate of the present invention are structured such that at least a specific number of metal-based particles of a relatively large size having a specific shape, as described above, are disposed in two dimensions with a specific spacing therebetween, they have remarkable features regarding plasmon resonance, as follows.

(1) The metal-based particle assembly and metal-based particle assembly film-layered substrate of the present invention can present significantly intense plasmon resonance. The metal-based particle assembly of the present invention presents plasmon resonance having an intensity that is not a simple sum total of localized plasmon resonances that individual metal-based particles exhibit for a specific wavelength; rather, it can present an intensity larger than that. More specifically, 30 or more metal-based particles each having a prescribed shape, which are spaced as prescribed, as described above, to be closely disposed, can have the individual metal-based particles interacting with each other to present significantly intense plasmon resonance. This is believed to be exhibited as the metal-based particles' localized plasmons interact with each other.

Generally, when a plasmonic material is subjected to absorption spectrum measurement through absorptiometry, a peak in an ultraviolet to visible light region is observed as a plasmon peak, and this plasmon peak's absorbance value in magnitude at a maximum wavelength thereof can be used to easily evaluate the plasmonic material's plasmon resonance in intensity, and when the metal-based particle assembly of the present invention that is layered on a substrate (a glass substrate) (i.e., a metal-based particle assembly film layered on the glass substrate) is subjected to absorption spectrum measurement through absorptiometry, it can present for a visible light region a maximum wavelength of a plasmon peak at a longest side in wavelength, and an absorbance at the maximum wavelength can be 1 or larger, further 1.5 or larger, and still further approximately 2.

(2) Plasmon resonance has an effect over a significantly extended range (or a plasmonic enhancement effect covers the range). This feature (or effect) is also not manifested unless metal-based particles having a prescribed shape are spaced as prescribed, as described above, to be closely disposed, and it is believed to be exhibited as the metal-based particles present localized plasmons interacting with each other. Conventionally, plasmon resonance has an effect over a range that is generally limited to that of the Förster distance (i.e., approximately 10 nm or smaller), whereas the present invention allows the range to be extended for example to approximately several hundreds nm.

Plasmon resonance having an effect over an extended range as described above is significantly advantageous in enhancing optical devices such as light emitting devices, photoelectric conversion devices (solar electronic devices) and the like. The plasmon resonance having an effect over the significantly extended range allows an active layer (e.g., a light emitting layer for the light emitting device, a light-absorbing layer for the photoelectric conversion device, and the like) typically having the thickness of several tens nm or larger to be entirely enhanced, thereby significantly improving the optical device's enhancement effect (such as luminous efficiency or conversion efficiency).

Furthermore, while a conventional plasmonic material needs to be disposed to have a distance to an active layer within the range of the Förster distance, the present invention can achieve effective enhancement via plasmon resonance with a plasmonic material disposed at a position for example 10 nm, further several tens nm (e.g., 20 nm), still further several hundreds nm away from the active layer. This means that, for example for a light emitting device, the plasmonic material, or the metal-based particle assembly, can be disposed in a vicinity of a light extraction face considerably remote from a light emitting layer, and significantly improved light extraction efficiency can thus be achieved. When a conventional plasmonic material is used to produce a light emitting device, the light emitting device necessitates having the plasmonic material disposed significantly close to a light emitting layer and hence significantly remote from a light extraction face, and accordingly, the emitted light would have a large portion thereof totally reflected at an interface of a variety of constituent layers of the light emitting device that the light passes through before it reaches the light extraction face, resulting in significantly small light extraction efficiency.

While the present invention employs a metal-based particle of a relatively large size that would alone be less prone to generate dipole-type localized plasmon for a visible light region, at least a specific number of such particles, which are each required to have a prescribed shape though, are spaced as prescribed to be closely disposed to achieve significantly intense plasmon resonance and plasmon resonance having an effect over a significantly extended range.

Furthermore, the metal-based particle assembly and metal-based particle assembly film-layered substrate of the present invention also have such a remarkable feature as follows.

(3) A plasmon peak's maximum wavelength presents a unique shift depending on the metal-based particles' average particle diameter and average interparticle distance. More specifically, when the metal-based particles have a fixed average interparticle distance while having increased average particle diameters, a plasmon peak at a longest side in wavelength for the visible light region has a maximum wavelength shifting toward a shorter side in wavelength (or blue-shifted). Similarly, when large-size metal-based particles have a fixed average particle diameter while having decreased average interparticle distances (i.e., when the particles are disposed more closely), a plasmon peak at a longest side in wavelength for the visible light region has a maximum wavelength shifting toward a shorter side in wavelength. This unique phenomenon is contradictory to the Mie-scattering theory generally accepted regarding plasmonic materials (according to this theory, larger particle diameters result in a plasmon peak having a maximum wavelength shifting toward a longer side in wavelength (or red-shifted)).

It is believed that such a unique blue shift as described above is also attributed to the fact that the metal-based particle assembly of the present invention is structured with relatively large-size metal-based particles closely disposed with a specific spacing therebetween, followed by the metal-based particles having their localized plasmons interacting with each other. The metal-based particle assembly of the present invention (when it is layered on a glass substrate) can present in an absorption spectrum for a visible light region, as measured through absorptiometry, a maximum wavelength of a plasmon peak at a longest side in wavelength, and the maximum wavelength can be in a range of for example from 350 to 550 nm, depending on the metal-based particles' shape and interparticle distance. Furthermore, the metal-based particle assembly of the present invention typically causes a blue shift of approximately 30-500 nm (e.g., 30-250 nm) as compared with that having metal-based particles with a sufficiently large interparticle distance (for example of 1 μm).

The plasmonic material of the present invention with a plasmon peak having a maximum wavelength blue-shifted as compared with conventional plasmonic material is significantly advantageous as follows. More specifically, while there is a strong demand for a blue luminescent material (or a luminescent material of a wavelength range close thereto; the same applies hereinafter), in particular a blue phosphorescent material, presenting high luminous efficiency, currently it is difficult to develop such a material with sufficiently practical usability. Applying the plasmonic material of the present invention that has a plasmon peak, for example, in the blue wavelength range to a light emitting device as an enhancement element allows the light emitting device to have its luminous efficiency enhanced to a sufficient extent even when the light emitting device uses a blue luminescent material of relatively low luminous efficiency. Furthermore, when it is applied to a photoelectric conversion device (a solar cell device), it for example allows a resonant wavelength to be blue-shifted so that a wavelength range that has not been utilized by the active layer per se can effectively be utilized to result in more efficient conversion.

Hereinafter the metal-based particle assembly and metal-based particle assembly film-layered substrate of the present invention will more specifically be described.

The metal-based particles that compose the metal-based particle assembly and metal-based particle assembly film-layered substrate are not specifically restricted as long as made of a material having a plasmon peak in an ultraviolet to visible light region in absorption spectrum measurement through absorptiometry in the form of nanoparticles or an assembly of such particles, and the material can include, for example: noble metals such as gold, silver, copper, platinum and palladium; metals such as aluminum and tantalum; alloys containing these noble metals or these metals; and metal compounds including these noble metals or these metals (such as metal oxides and metal salts). Inter alia, noble metals such as gold, silver, copper, platinum and palladium are preferable, and silver is more preferable as it is inexpensive and provides small absorption (or has a small imaginary part of a dielectric function in visible light wavelengths).

The metal-based particles have an average particle diameter within a range of 200-1600 nm, and to effectively obtain the features (effects) of items (1) to (3) it falls within a range preferably of 200-1200 nm, more preferably 250-500 nm, still more preferably 300-500 nm. It should be noted here that a metal-based particle of a large size having an average particle diameter for example of 500 nm is alone not observed to show substantially effective enhancement via localized plasmon. The present invention provides at least a prescribed number (30) of such large-size metal-based particles spaced as prescribed to be closely disposed to realize significantly intense plasmon resonance and plasmon resonance having an effect over a significantly extended range.

The average particle diameter of the metal-based particle, as referred to herein, is obtained as follows: a metal-based particle assembly (film) having metal-based particles disposed in two dimensions is observed with an SEM from directly above to obtain an SEM image thereof, and therein ten particles are selected at random and in each particle's image 5 tangential diametrical lines are drawn at random (note that the straight lines serving as the tangential diametrical lines can pass through only inside the image of the particle and one of the lines is a straight line passing through only inside the particle and drawable to be the longest) and their average value serves as the particle's diameter and the 10 selected particles' respective such particle diameters are averaged to obtain the average particle diameter of the metal-based particle. The tangential diametrical line is defined as a perpendicular line connecting a spacing between two parallel lines sandwiching the particle's contour (in a projected image) in contact therewith (see the Nikkan Kogyo Shimbun, Ltd., "Particle Measurement Technique", 1994, page 5).

The metal-based particle has an average height within a range of 55-500 nm, and to effectively obtain the features (effects) of items (1) to (3) it falls within a range preferably of 55-300 nm, more preferably 70-150 nm. The average height of the metal-based particles is obtained as follows: the metal-based particle assembly (film) is observed with an AFM to obtain an AFM image thereof and therein 10 particles are selected at random and measured in height and their measurements are averaged to obtain the average height.

The metal-based particle has an aspect ratio within a range of 1-8 and to effectively obtain the features (effects) of items (1) to (3) it falls within a range preferably of 2-8, more preferably 2.5-8. The aspect ratio of the metal-based particle is defined as a ratio of the above average particle diameter to the above average height (i.e., average particle diameter/average height). While the metal-based particle may be spherical, preferably it is oblate having an aspect ratio exceeding one.

While the metal-based particle preferably has a smoothly curved surface in view of exciting significantly effective plasmon and in particular it is more preferable that the metal-based particle be oblate having a smoothly curved surface, the metal-based particle may have a surface with small recesses and projections (or roughness) to some extent and in that sense the metal-based particle may be indefinite in shape.

Preferably, the metal-based particles have variation therebetween in size as minimal as possible in view of uniformity in intensity of plasmon resonance within a plane of the metal-based particle assembly (film). Even if there is a small variation in particle diameter, it is not preferable that large-size particles have an increased distance therebetween and it is preferable that particles of small size be introduced between the large-size particles to help the large-size particles to exhibit their interaction.

The metal-based particle assembly and metal-based particle assembly film-layered substrate of the present invention have adjacent metal-based particles disposed to have an average distance therebetween (hereinafter also referred to as average interparticle distance) within a range of 1-150 nm. Such closely disposed metal-based particles present the features (or effects) of items (1) to (3). To effectively obtain the features (or effects) of items (1) to (3), the average distance is within a range preferably of 1-100 nm, more preferably 1-50 nm, still more preferably 1-20 nm. An average interparticle distance smaller than 1 nm results in occurrence of electron transfer between the particles attributed to the Dexter mechanism, which disadvantageously deactivates localized plasmon.

The average interparticle distance, as referred to herein, is obtained as follows. A metal-based particle assembly (film) having metal-based particles disposed in two dimensions is observed with an SEM from directly above to obtain an SEM image thereof, and therein 30 particles are selected at random and for each selected particle an interparticle distance to an adjacent particle is obtained and the 30 particles' such interparticle distances are averaged to obtain an average interparticle distance. In obtaining an interparticle distance to an adjacent particle, a distance to any adjacent particle, as obtained between their surfaces, is measured, and such measurements are averaged to obtain the interparticle distance.

The metal-based particle assembly (film) includes 30 or more metal-based particles, preferably 50 or more metal-based particles. 30 or more metal-based particles assembled together present the metal-based particles' localized plasmons interacting with each other effectively and thus present significantly intense plasmon resonance.

When the metal-based particle assembly or metal-based particle assembly film-layered substrate is applied to an optical device as an enhancement element, in light of the optical device's typical device area the metal-based particle assembly can include 300 or more metal-based particles, and furthermore, 17500 or more metal-based particles, for example.

The metal-based particle assembly (film) includes metal-based particles having a number density preferably of 7 particles/$\mu m^2$ or larger, more preferably 15 particles/$\mu m^2$ or larger.

The metal-based particle assembly of the present invention preferably has metal-based particles insulated from each other, that is, it is non-conductive between adjacent metal-based particles (or non-conductive as a metal-based particle assembly film). If some or all of the metal-based particles can pass/receive electrons to/from each other, the plasmon peak loses sharpness and thus resembles an absorption spectrum of bulk metal, and high plasmon resonance is not obtained, either. Accordingly, it is preferable that the metal-based particles be surely separated and have no conductive substance interposed therebetween.

It is preferable that a substrate that is used for the metal-based particle assembly film-layered substrate of the present invention be a non-conductive substrate to ensure that the metal-based particle assembly film is non-conductive. The non-conductive substrate can be formed of glass, a variety of inorganic insulating materials ($SiO_2$, $ZrO_2$, mica, and the like), and a variety of plastic materials. In particular, an optically transparent substrate is preferable, as, for example, a light emitting device with the substrate applied thereto allows light to be extracted from a surface of the substrate opposite to that having the metal-based particle assembly film layered thereon.

The metal-based particle assembly film-layered substrate preferably further includes an insulating layer covering a surface of each metal-based particle. Such an insulating layer is preferable not only in ensuring that the metal-based particle assembly film is non-conductive (between the metal-based particles), as described above, but also in applying the substrate to an optical device. More specifically, while an optical device such as electrical energy-driven light emitting device has each constituent layer with a current passing therethrough, the metal-based particle assembly film with a current passing therethrough may result in failing to obtain a sufficient emission enhancement effect via plasmon resonance. When the metal-based particle assembly film that is capped by the insulating layer is applied to the optical device, the optical device can have the metal-based particle assembly film electrically insulated from an adjacent constituent layer of the optical device and thus have the metal-based particle assembly film without a current injected into the metal-based particles that compose the metal-based particle assembly film.

The insulating layer is formed of any material that is not specially restricted as long as having satisfactory insulation, and it can be formed for example of spin on glass (SOG; containing organic siloxane material for example) and in addition thereto $SiO_2$, $Si_3N_4$ or the like. While the insulating layer is of any thickness that is not restricted as long as ensuring desired insulation, it is better that the insulating layer is smaller in thickness in a range ensuring desired insulation as it is preferable that an active layer when applied to an optical device (e.g., a light emitting layer for a light emitting device, a light-absorbing layer for a photoelectric conversion device, or the like) and the metal-based particle assembly film be closer in distance, as will be described later.

The plasmonic material (metal-based particle assembly and metal-based particle assembly film-layered substrate) of the present invention is significantly useful as an enhancement element for optical devices such as light emitting devices, and photoelectric conversion devices (solar cell devices). When the plasmonic material of the present invention is applied to an optical device, the optical device can provide significant improvements in luminous efficiency or conversion efficiency. As has been set forth above, the plasmonic material of the present invention can present significantly intense plasmon resonance, and furthermore, plasmon resonance having an effect over a significantly extended range (or a plasmonic enhancement effect covering the range), and thus allows an active layer (e.g., a light emitting layer for a light emitting device, a light-absorbing layer for a photoelectric conversion device, or the like) having the thickness for example of 10 nm or larger, further 20 nm or larger, still further the thickness larger than that to be entirely enhanced. Furthermore, as has been set forth above, it also allows an active layer disposed at a position for example 10 nm, further several tens nm (e.g., 20 nm), still further several hundreds nm distant to be also significantly effectively enhanced.

Note that there is a tendency that, for its nature, the plasmonic enhancement effect decreases as the distance between the active layer and the metal-based particle assembly increases, so it is preferable that the distance be smaller. The active layer and the metal-based particle assembly have a distance therebetween preferably of 100 nm or smaller, more preferably 20 nm or smaller, and still more preferably 10 nm or smaller.

Preferably the active layer presents an emission wavelength (for example for a light emitting device) or an absorption wavelength (for example for a photoelectric conversion device) with a maximum wavelength matching or close to that of the plasmon peak of the metal-based particle assembly film. This allows plasmon resonance to contribute to a more effectively increased emission enhancement effect. The maximum wavelength of the plasmon peak of the metal-based particle assembly film is controllable by adjusting the film's constituent metal-based particles in metal type, average particle diameter, average height, aspect ratio, and/or average interparticle distance.

The above light emitting layer can for example be that formed of 1) monomolecular film including dye molecules disposed in a plane, 2) a matrix doped with dye molecules, 3) a luminescent small molecule, 4) a luminescent polymer, or the like.

Light emitting layer 1) can be obtained by applying a dye molecule-containing liquid with spin-coating and subsequently removing a solvent. The dye molecule specifically includes by way of example rhodamine-based dyes such as rhodamine 101, rhodamine 110, rhodamine 560, rhodamine 6G, rhodamine B, rhodamine 640, and rhodamine 700 sold by Exciton, a coumarin-based dye such as coumarin 503 sold by Exciton, and the like.

Light emitting layer 2) can be obtained by applying a liquid containing dye molecules and a matrix material with spin-coating, and subsequently removing a solvent. The matrix material can be a transparent polymer such as polyvinyl alcohol and polymethyl methacrylate. The dye molecule in a specific example can be similar to that of light emitting layer 1).

Light emitting layer 3) can be obtained through dry or wet deposition including spin-coating, vapor deposition or the like. The luminescent small molecule is specifically exemplified by tris(8-quinolinolato) aluminum complex [tris(8-hydroxyquinoline) aluminum complex; $Alq_3$], bis(benzoquinolinolato)beryllium complex [BeBq], and the like.

Light emitting layer 4) can be obtained by a wet deposition using a luminescent polymer containing liquid such as spin-coating. The luminescent polymer is specifically exemplified by a π-conjugated polymer such as F8BT [poly(9,9-dioctylfluorene-alt-benzothiadiazole)], poly(p-phenylenevinylene), polyalkylthiophene, and the like.

<Method for Producing Metal-Based Particle Assembly and Metal-Based Particle Assembly Film-Layered Substrate>

The plasmonic material (metal-based particle assembly and metal-based particle assembly film-layered substrate) of the present invention can be produced in such a method as follows:

(1) a bottom-up method to grow metal-based particles from minute seeds on a substrate;

(2) a method in which a metal-based particle that has a prescribed shape is covered with a protection layer made of an amphiphilic material and having a prescribed thickness, and the resultant is then subjected to langmuir blodgett (LB) deposition to be formed in a film on a substrate; and (3) other methods, such as a method of post-treating a thin film obtained by vapor deposition, sputtering or the like; resist-processing; etching processing; a casting method using a liquid having metal-based particles dispersed therein, and the like.

It is important that method (1) includes the step of growing a metal-based particle at a significantly low speed on a substrate adjusted to have a prescribed temperature (hereinafter also referred to as the particle growth step). A production method including the particle growth step can provide a satisfactorily controlled layer (or thin film) of a metal-based particle assembly having 30 or more metal-based particles mutually separated and thus disposed in two dimensions, and having a shape within a prescribed range (an average particle diameter of 200 to 1600 nm, an average height of 55 to 500 nm, and an aspect ratio of 1 to 8) and still preferably an average interparticle distance within a prescribed range (1-150 nm).

In the particle growth step, the metal-based particle is grown on the substrate preferably at an average height growth rate smaller than 1 nm/minute, more preferably 0.5 nm/minute or smaller. The average height growth rate as referred to herein can also be referred to as an average deposition rate or the metal-based particle's average thickness growth rate, and is defined by the following expression:

metal-based particle's average height/metal-based particle growth time (supplying time of a metal-based material).

The "metal-based particle's average height" is defined as set forth above.

In the particle growth step, the substrate is set in temperature preferably within a range of 100-450° C., more preferably 200-450° C., still more preferably 250-350° C., and particularly still more preferably 300° C. or thereabound (300° C.±approximately 10° C.).

When the production method includes the particle growth step to grow metal-based particles at an average height growth rate smaller than 1 nm/minute on a substrate adjusted in temperature within the range of 100-450° C., the particles are initially grown such that a supplied metal-based material forms a plurality of island structures, and as the metal-based material is further supplied the island structures are further grown and thus merged with neighboring island structures, and consequently, metal-based particles having a relatively large average particle diameter are closely disposed while the metal-based particles are each completely separated from each other to form a metal-based particle assembly layer. Thus a metal-based particle assembly layer can be produced that is formed of metal-based particles controlled to have a shape within a prescribed range (in average particle diameter, average height, and aspect ratio) and still preferably an average interparticle distance within a prescribed range.

Furthermore, the average height growth rate, the substrate's temperature and/or the metal-based particle growth time (the supplying time of the metal-based material) can be adjusted to also control within a prescribed range the average particle diameter, the average height, the aspect ratio, and/or the average interparticle distance of the metal-based particles grown on the substrate.

Furthermore, the production method including the particle growth step also allows the particle growth step to be performed such that conditions other than the substrate's temperature and the average height growth rate are selected relatively freely, and the method thus also advantageously allows a metal-based particle assembly layer of a desired size to be efficiently formed on a substrate of a desired size.

If the average height growth rate is 1 nm/minute or larger, or the substrate has a temperature lower than 100° C. or higher than 450° C., then before the island structure is grown to be large the island structure forms a continuum with a neighboring island structure and a metal-based assembly formed of metal-based particles mutually completely separated and having a large particle diameter cannot be obtained or a metal-based assembly formed of metal-based particles having a desired shape cannot be obtained (for example, it would depart in average height, average interparticle distance, and aspect ratio from a desired range).

While the metal-based particles are grown under a pressure (in an apparatus's chamber), which may be any pressure that allows the particles to be grown, it is normally lower than atmospheric pressure. While the pressure's lower limit is not limited to a specific value, it is preferably 6 Pa or larger, more preferably 10 Pa or larger, still more preferably 30 Pa or larger, as such pressure helps to adjust the average height growth rate within the range indicated above.

The metal-based particles can specifically be grown on a substrate in any method allowing the particles to be grown at an average height growth rate smaller than 1 nm/minute, and the method can include sputtering, and vapor deposition such as vacuum deposition. Preferable sputtering is direct current (DC) sputtering as it allows a metal-based particle assembly layer to be grown relatively conveniently and also facilitates maintaining the average height growth rate smaller than 1 nm/minute. The sputtering may be done in any system and it can for example be an ion gun, or direct current argon ion sputtering to expose a target to argon ions generated by a plasma discharge and accelerated in an electric field. The sputtering is done with a current value, a voltage value, a substrate-to-target distance and other conditions adjusted as appropriate to grow particles at the average height growth rate smaller than 1 nm/minute.

Note that to obtain a satisfactorily controlled metal-based particle assembly layer formed of metal-based particles having a shape within a prescribed range (in average particle diameter, average height, and aspect ratio) and still preferably an average interparticle distance within a prescribed range, it is preferable that the particle growth step be performed at the average height growth rate smaller than 1 nm/minute and in addition thereto an average particle diameter growth rate smaller than 5 nm, and when the average height growth rate is smaller than 1 nm/minute, the average particle diameter growth rate is normally smaller than 5 nm. The average particle diameter growth rate is more preferably 1 nm/minute or smaller. The average particle diameter growth rate is defined by the following expression:

metal-based particle's average particle diameter/metal-based particle growth time (supplying time of a metal-based material).

The "metal-based particle's average particle diameter" is defined as set forth above.

The metal-based particle growth time (or metal-based material supply time) in the particle growth step is a period of time that at least allows metal-based particles carried on a substrate to attain a shape within a prescribed range and still preferably an average interparticle distance within a prescribed range and that is smaller than a period of time allowing the particles to depart from the shape within the prescribed range and the average interparticle distance within the prescribed range. For example, even if particle growth is performed at an average height growth rate and substrate temperature within the above prescribed ranges, an extremely long period of time for growth results in a metal-based material carried in an excessively large amount and accordingly it will not form an assembly of mutually separated metal-based particles and instead form a continuous film or be metal-based particles excessively large in average particle diameter or average height.

Accordingly it is necessary to grow metal-based particles for an appropriately set period of time (or to stop the particle growth step at an appropriate time), and such time can be set based for example on a relationship between an average height growth rate and a substrate's temperature and a shape and average interparticle distance of metal-based particles of a metal-based particle assembly obtained, as previously obtained through an experiment. Alternatively a time elapsing before a thin film of a metal-based material grown on a substrate exhibits conduction, that is, a time allowing the thin film to be a continuous film rather than a metal-based particle assembly film, may previously be obtained through an experiment and the particle growth step may be stopped before that time is reached.

The metal-based particles are grown on a substrate preferably having as smooth a surface as possible and, inter alia, more preferably a surface that is smooth at the atomic level. When the substrate has a smoother surface, thermal energy received from the substrate helps a growing metal-based particle to merge with a surrounding, adjacent metal-based particle and thus grow, and thus there is a tendency to facilitate providing a film formed of metal-based particles of a larger size.

EXAMPLES

Hereinafter, examples will be described to more specifically describe the present invention, although the present invention is not limited thereto.

[Producing Metal-Based Particle Assembly and Metal-Based Particle Assembly Film-Layered Substrate]

Example 1

A direct-current magnetron sputtering apparatus was used to grow silver particles significantly slowly on a soda glass substrate to form a thin film of a metal-based particle assembly on the entire surface of the substrate to produce a metal-based particle assembly layer-layered substrate under the following conditions:
  gas used: argon;
  pressure in chamber (sputtering-gas pressure): 10 Pa;
  substrate-to-target distance: 100 mm;
  sputtering power: 4 W;
  average particle diameter growth rate (average particle diameter/sputtering time): 0.9 nm/minute;
  average height growth rate (=average deposition rate=average height/sputtering time): 0.25 nm/minute;
  substrate's temperature: 300° C.; and
  substrate's size and shape: a square with each side having a length of 5 cm.

Figure 2:
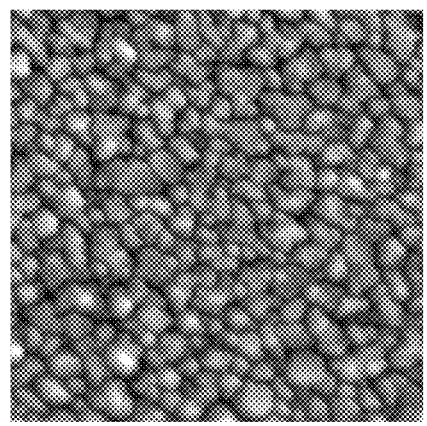
FIG. 2 shows an AFM image of the metal-based particle assembly film in the metal-based particle assembly film-layered substrate obtained in Example 1.

FIG. 1 shows SEM images of a metal-based particle assembly film in the obtained metal-based particle assembly film-layered substrate, as observed from directly above. FIG. 1(a) shows an image enlarged as scaled 10000 times and FIG. 1(b) shows an image enlarged as scaled 50000 times. FIG. 2 shows an AFM image of the metal-based particle assembly film in the metal-based particle assembly film-layered substrate obtained. The AFM image was obtained via "VN-8010" produced by KEYENCE CORPORATION (this is also applied hereinafter). FIG. 2 shows an image having a size of 5 μm×5 μm.

A calculation with reference to the FIG. 1 SEM images indicates that the present example provided a metal-based particle assembly configured of silver particles having an average particle diameter of 335 nm and an average interparticle distance of 16.7 nm, based on the definition indicated above. Furthermore, from the FIG. 2 AFM image, an average height of 96.2 nm was obtained. From these values the silver particle's aspect ratio (average particle diameter/average height) was calculated to be 3.48 and it can also be found from the obtained images that the silver particles have an oblate shape. Furthermore, it can be seen from the SEM images that the metal-based particle assembly of the present example has approximately $6.25 \times 10^{10}$ silver particles (approximately 25 particles/μm$^2$).

Furthermore, the obtained metal-based particle assembly film-layered substrate had the metal-based particle assembly film connected at a surface to a tester [multimeter "E2378A" produced by Hewlett Packard Co.] to confirm conduction, and it has been found to be non-conductive.

Example 2

An aqueous silver nanoparticle dispersion (produced by Mitsubishi Paper Mills, Ltd., silver nanoparticle concentration: 25% by weight) was diluted with pure water to have a silver nanoparticle concentration of 2% by weight. Then to the aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a silver nanoparticle coating liquid.

Then, the silver nanoparticle coating liquid was applied with spin-coating at 1000 rpm on a 1 mm thick soda glass substrate having a surface wiped with acetone and thereafter the substrate was left as it was in the atmosphere for 1 minute and subsequently annealed in an electric furnace of 550° C. for 40 seconds. A silver nanoparticle layer was thus formed, and on the nanoparticle layer the silver nanoparticle coating liquid was again applied with spin-coating at 1000 rpm and thereafter left as it was in the atmosphere for 1 minute and subsequently annealed in an electric furnace of 550° C. for 40 seconds to obtain a metal-based particle assembly film-layered substrate.

Figure 3:
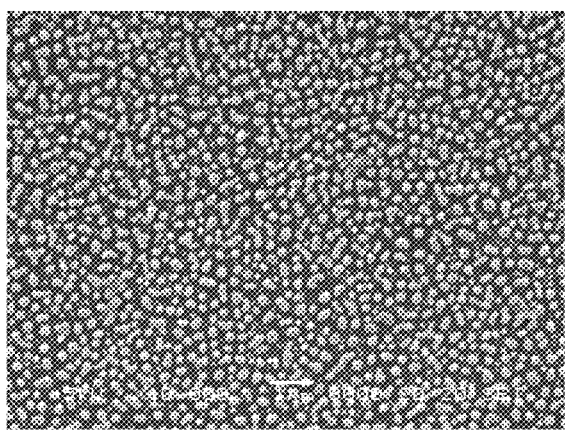
FIG. 3 shows SEM images (as scaled 10000 times and 50000 times) of a metal-based particle assembly film in a metal-based particle assembly film-layered substrate obtained in Example 2, as observed from directly above.
Figure 3:
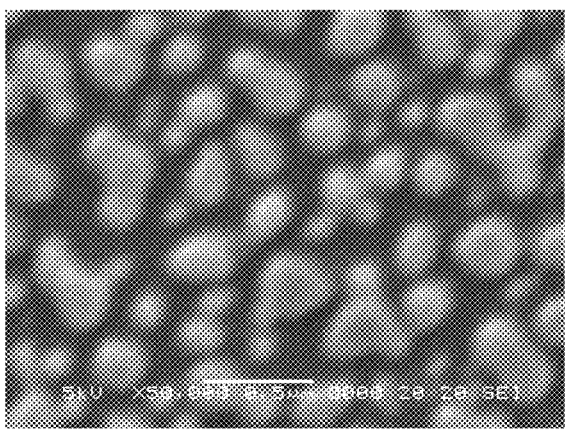
Figure 4:
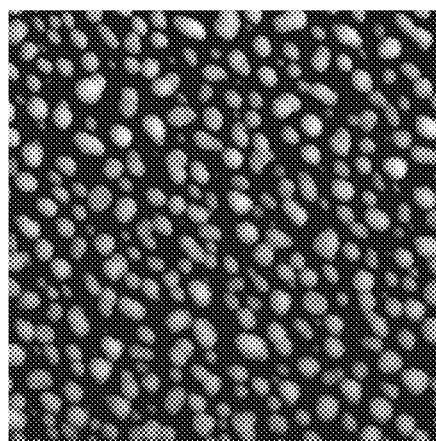
FIG. 4 shows an AFM image of the metal-based particle assembly film in the metal-based particle assembly film-layered substrate obtained in Example 2.

FIG. 3 shows SEM images of a metal-based particle assembly film in the obtained metal-based particle assembly film-layered substrate, as observed from directly above. FIG. 3(a) shows an image enlarged as scaled 10000 times and FIG. 3(b) shows an image enlarged as scaled 50000 times. FIG. 4 shows an AFM image of the metal-based particle assembly film in the metal-based particle assembly film-layered substrate obtained. FIG. 4 shows an image having a size of 5 μm×5 μm.

A calculation with reference to the FIG. 3 SEM images indicates that the present example provided a metal-based particle assembly configured of silver particles having an average particle diameter of 293 nm and an average interparticle distance of 107.8 nm, based on the definition indicated above. Furthermore, from the FIG. 4 AFM image, an average height of 93.0 nm was obtained. From these values the silver particle's aspect ratio (average particle diameter/average height) was calculated to be 3.15 and it can also be found from the obtained images that the silver particles have an oblate shape. Furthermore, it can be seen from the SEM images that the metal-based particle assembly of the present example has approximately $3.13 \times 10^{10}$ silver particles (approximately 12.5 particles/μm$^2$).

Furthermore, the obtained metal-based particle assembly film-layered substrate had the metal-based particle assembly film connected at a surface to a tester [multimeter "E2378A" produced by Hewlett Packard Co.] to confirm conduction, and it has been found to be non-conductive.

Comparative Examples 1 and 2

The direct-current magnetron sputtering was done with a varied deposition time to produce metal-based particle assembly film-layered substrates for Comparative Examples 1 and 2. The metal-based particle assembly film-layered substrate of Comparative Example 1 had metal-based particles having approximately the same shape, aspect ratio and average interparticle distance as Example 1 except that the metal-based particles had an average height of approximately 10 nm, and the metal-based particle assembly film-layered substrate of Comparative Example 2 had metal-based particles having approximately the same shape, aspect ratio and average interparticle distance as Example 1 except that the metal-based particles had an average height of approximately 30 nm.

[Measuring Absorption Spectrum of Metal-Based Particle Assembly Film-Layered Substrate]

Figure 5:
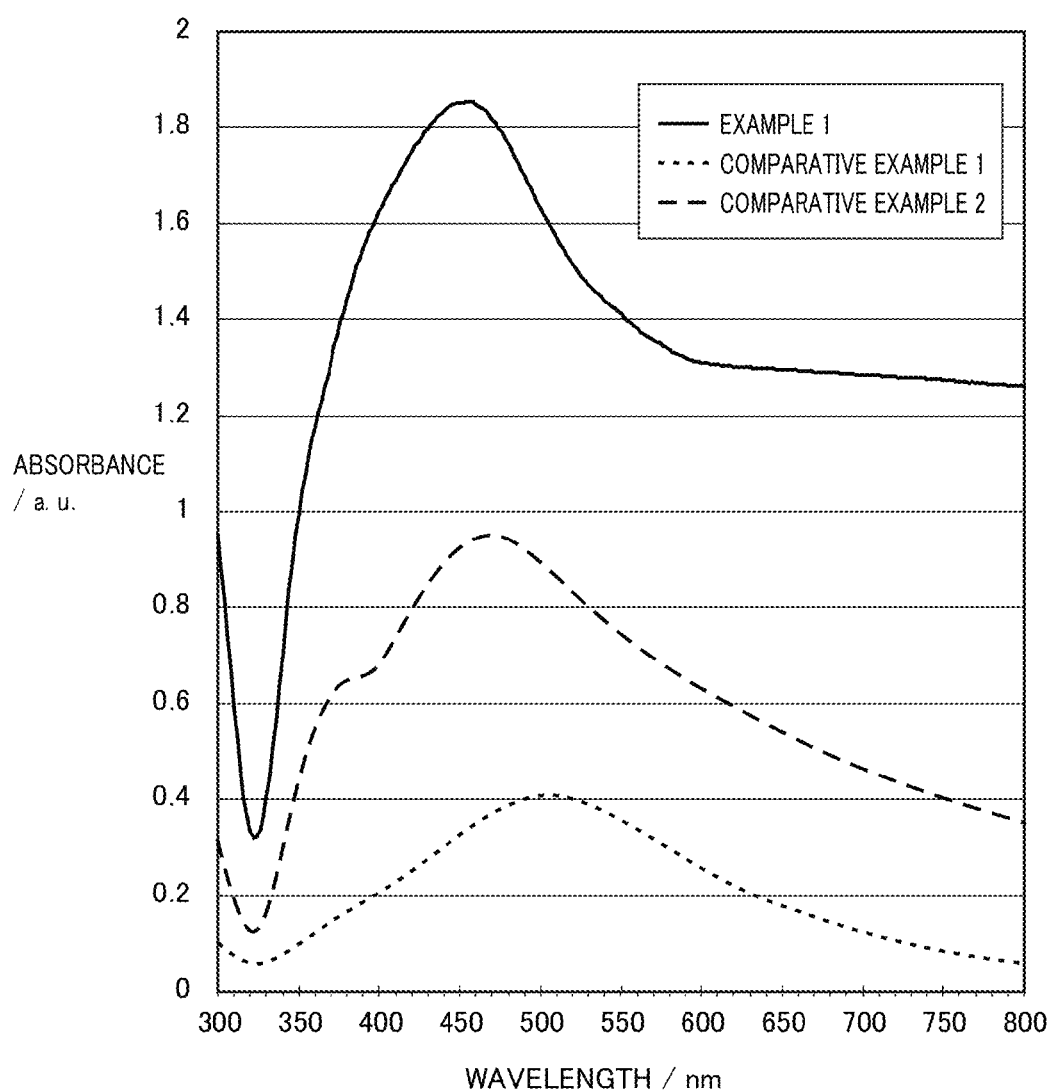
FIG. 5 represents absorption spectra of the metal-based particle assembly film-layered substrates obtained in Example 1 and Comparative Examples 1 and 2.

FIG. 5 represents absorption spectra, as measured through absorptiometry, of the metal-based particle assembly film-layered substrates obtained in Example 1 and Comparative Examples 1 and 2. As indicated in a nonpatent document (K. Lance Kelly, et al., "The Optical Properties of Metal Nanoparticles: The Influence of Size, Shape, and Dielectric Environment", The Journal of Physical Chemistry B, 2003, 107, 668), an oblate silver particle as produced in Example 1 alone typically has a plasmon peak around 550 nm and 650 nm for average particle diameters of 200 nm and 300 nm, respectively.

In contrast, it can be seen that Example 1's metal-based particle assembly film-layered substrate, with its constituent silver particles having an average particle diameter of approximately 300 nm (335 nm), nonetheless presents for a visible light region a maximum wavelength of a plasmon peak at a longest side in wavelength, and the maximum wavelength is around approximately 450 nm, or shifted to a shorter side in wavelength, as shown in FIG. 5. This phenomenon is manifested characteristically when the silver particles are large-size particles having the above prescribed shape and also have the above prescribed average interparticle distance and are disposed significantly closely, as provided in Example 1. Such a phenomenon would not rationally be understandable without considering that the particles that are closely adjacent allow their respective, internally caused plasmons to interact with each other.

Furthermore, the plasmon peak's maximum wavelength also depends on the metal-based particles' average particle diameter. For example, Comparative Examples 1 and 2 have small average particle diameters, and accordingly have a plasmon peak at a side considerably longer in wavelength than Example 1, with maximum wavelengths of approximately 510 nm and approximately 470 nm, respectively.

Furthermore, Example 1 shows for the visible light region a maximum wavelength of a plasmon peak at a longest side in wavelength, and an absorbance at the maximum wavelength is approximately 1.9, which is significantly higher than Comparative Examples 1 and 2 and it can be seen therefrom that Example 1 provides a metal-based particle assembly presenting significantly intense plasmon resonance.

Figure 6:
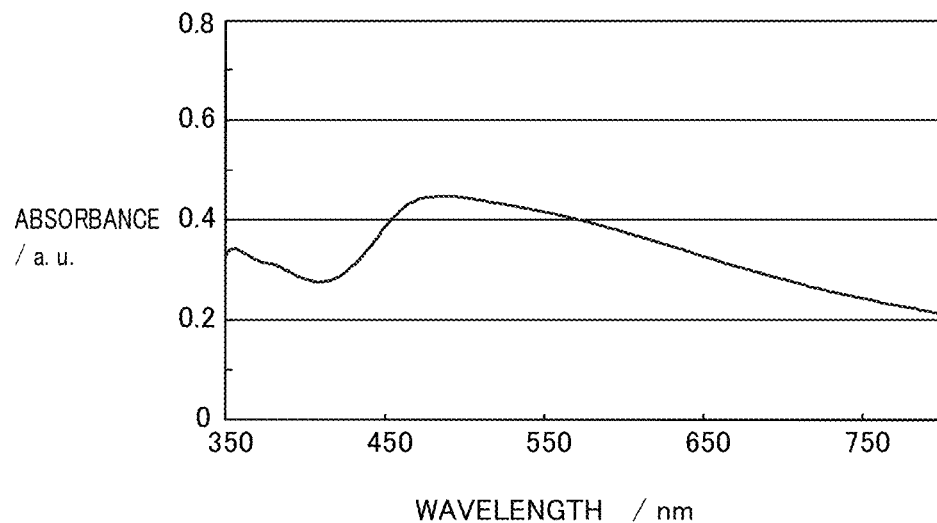
FIG. 6 represents an absorption spectrum of the metal-based particle assembly film-layered substrate obtained in Example 2.

FIG. 6 represents an absorption spectrum, as measured through absorptiometry, of the metal-based particle assembly film-layered substrate obtained in Example 2. It presented for the visible light region a maximum wavelength of a plasmon peak at a longest side in wavelength, and the maximum wavelength was 488 nm.

Note that the absorption spectrum is obtained as follows: a metal-based particle assembly film-layered substrate is exposed to light of the ultraviolet to visible light region incident on a back surface thereof (i.e., a side opposite to the metal-based particle assembly film) in a direction perpendicular to a substrate surface and intensity I of transmitted light omnidirectionally transmitted toward the metal-based particle assembly film is measured with an integrating sphere spectrophotometer. On the other hand, a substrate which does not have a metal-based particle assembly film and has the same thickness and the same material as the substrate of said metal-based particle assembly film-layered substrate is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. The axis of ordinate represents absorbance, which is represented by the following expression:

Absorbance=$-\log_{10}(I/I_0)$.

[Producing Photoexcited Light Emitting Device and Assessing Emission Enhancement]

Example 3-1

Silver particles were grown under approximately the same conditions as Example 1 to provide on a 0.5 mm thick soda glass substrate a metal-based particle assembly film similar to that of Example 1. The metal-based particle assembly film had metal-based particles having the same shape and average interparticle distance as Example 1 except that the metal-based particles had an average height of 66.1 nm.

Then a solution for a coumarin-based light emitting layer was applied with spin-coating on the metal-based particle assembly film at 3000 rpm to provide a significantly thin coumarin-based light emitting layer (on the scale of monomolecular film) to thus obtain a light emitting device. The solution for the coumarin-based light emitting layer was prepared as follows. Initially, a coumarin dye (Coumarin 503 from Exciton) was dissolved in ethanol to obtain a 5 mM coumarin solution. Separately, an organic SOG material ("OCD T-7 5500T" produced by TOKYO OHKA KOGYO CO., LTD.) was diluted with ethanol to be 33% by volume. The organic SOG material diluted to be 33% by volume, the 5 mM coumarin solution, and ethanol were mixed together to have a volumetric ratio of 1:5:5 to obtain the solution for the coumarin-based light emitting layer.

Example 3-2

Silver particles were grown under the same conditions as Example 3-1 to provide on a 0.5 mm thick soda glass substrate the metal-based particle assembly film described in Example 3-1. Thereafter immediately a SOG solution was applied with spin-coating on the metal-based particle assembly film to have an insulating layer having an average thickness of 10 nm layered thereon. For the SOG solution was used "OCD T-7 5500T", an organic SOG material produced by TOKYO OHKA KOGYO CO., LTD., which was then diluted with ethanol. "Average thickness" means average thickness as provided on a metal-based particle assembly film having an irregular surface, and it was measured as thickness provided when the SOG solution was directly applied with spin-coating on the soda glass substrate (this is also applied to the following examples and comparative examples). When the average thickness has a relatively small value, the metal-based particle assembly film may have the insulating layer formed only in a trough and may not have its outermost surface entirely covered therewith.

Then the same solution for the coumarin-based light emitting layer as used in Example 3-1 was applied with spin-coating at 3000 rpm on the outermost surface of the metal-based particle assembly film having the insulating layer to provide a significantly thin coumarin-based light emitting layer (on the scale of monomolecular film) to thus obtain a light emitting device.

Example 3-3

A light emitting device was produced similarly as done in Example 3-2 except that the insulating layer had an average thickness of 30 nm.

Example 3-4

A light emitting device was produced similarly as done in Example 3-2 except that the insulating layer had an average thickness of 80 nm.

Example 3-5

A light emitting device was produced similarly as done in Example 3-2 except that the insulating layer had an average thickness of 150 nm.

Example 3-6

A light emitting device was produced similarly as done in Example 3-2 except that the insulating layer had an average thickness of 350 nm.

Comparative Example 3-1

An aqueous silver nanoparticle dispersion (produced by Mitsubishi Paper Mills, Ltd., silver nanoparticle concentration: 25% by weight) was diluted with pure water to have a silver nanoparticle concentration of 6% by weight. Then to the aqueous silver nanoparticle dispersion 1% by volume of a surfactant was added and sufficiently agitated and thereafter to the obtained aqueous silver nanoparticle dispersion 80% by volume of acetone was added and sufficiently shaken and thus mixed together at ordinary temperature to prepare a silver nanoparticle coating liquid.

Then, the silver nanoparticle coating liquid was applied with spin-coating at 1500 rpm on a 1 mm thick soda glass substrate having a surface wiped with acetone and thereafter the substrate was left as it was in the atmosphere for 1 minute and subsequently annealed in an electric furnace of 550° C. for 5 minutes to obtain a metal-based particle assembly film-layered substrate.

Figure 7:
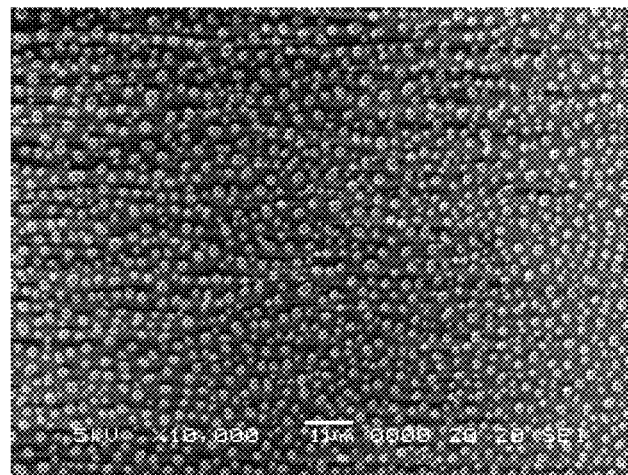
FIG. 7 shows an SEM image (as scaled 10000 times) of a metal-based particle assembly film in a metal-based particle assembly film-layered substrate obtained in Comparative Example 3-1, as observed from directly above.
Figure 8:
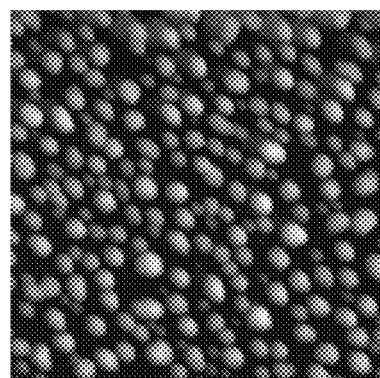
FIG. 8 shows an AFM image of the metal-based particle assembly film in the metal-based particle assembly film-layered substrate obtained in Comparative Example 3-1.

FIG. 7 shows an SEM image, enlarged as scaled 10000 times, of a metal-based particle assembly film in the metal-based particle assembly film-layered substrate obtained in Comparative Example 3-1, as observed from directly above. FIG. 8 shows an AFM image of the metal-based particle assembly film in the metal-based particle assembly film-layered substrate obtained in Comparative Example 3-1. FIG. 8 shows an image having a size of 5 μm×5 p.m.

A calculation with reference to the FIG. 7 SEM image indicates that Comparative Example 3-1 provided a metal-based particle assembly configured of silver particles having an average particle diameter of 278 nm and an average interparticle distance of 195.5 nm, based on the definition indicated above. Furthermore, from the FIG. 8 AFM image, an average height of 99.5 nm was obtained. From these values the silver particle's aspect ratio (average particle diameter/average height) was calculated to be 2.79 and it can also be found from the obtained images that the silver particles have an oblate shape. Furthermore, it can be seen from the SEM image that the metal-based particle assembly of Comparative Example 3-1 has approximately $2.18\times10^{10}$ silver particles (approximately 8.72 particles/$\mu m^2$).

Figure 9:
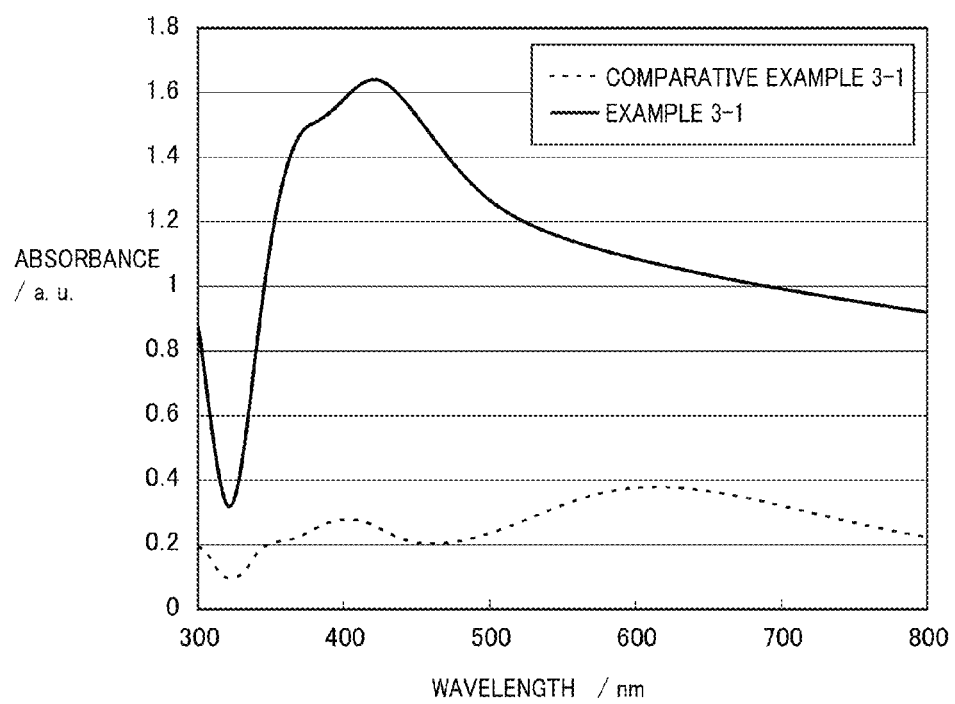
FIG. 9 represents absorption spectra of the metal-based particle assembly film-layered substrates obtained in Example 3-1 and Comparative Example 3-1.

FIG. 9 shows absorption spectra of the metal-based particle assembly film-layered substrates obtained in Example 3-1 and Comparative Example 3-1, as measured as described above. It can be found that Example 3-1 presents in an absorption spectrum a peak wavelength (a maximum wavelength of a plasmon peak at a longest side in wavelength) blue-shifted as compared with that of the absorption spectrum of Comparative Example 3-1, and the plasmon peak at the longest side in wavelength is sharpened and an absorbance at the peak's maximum wavelength is higher.

Then, similarly as done in Example 3-1, the metal-based particle assembly film was provided thereon with a coumarin-based light emitting layer to obtain a light emitting device.

Comparative Example 3-2

The same method as Comparative Example 3-1 was employed to provide on a 1 mm thick soda glass substrate the metal-based particle assembly film described in Comparative Example 3-1. Thereafter immediately a SOG solution was applied with spin-coating on the metal-based particle assembly film to have an insulating layer having an average thickness of 10 nm layered thereon. For the SOG solution was used "OCD T-7 5500T", an organic SOG material produced by TOKYO OHKA KOGYO CO., LTD., which was then diluted with ethanol.

Then, similarly as done in Example 3-2, the metal-based particle assembly film having the insulating layer as described above was provided at an outermost surface thereof with a coumarin-based light emitting layer to obtain a light emitting device.

Comparative Example 3-3

A light emitting device was produced similarly as done in Comparative Example 3-2 except that the insulating layer had an average thickness of 30 nm.

Comparative Example 3-4

A light emitting device was produced similarly as done in Comparative Example 3-2 except that the insulating layer had an average thickness of 80 nm.

Comparative Example 3-5

A light emitting device was produced similarly as done in Comparative Example 3-2 except that the insulating layer had an average thickness of 150 nm.

Comparative Example 3-6

A light emitting device was produced similarly as done in Comparative Example 3-2 except that the insulating layer had an average thickness of 350 nm.

Comparative Example 4

A light emitting device was produced similarly as done in Example 3-1 except that the metal-based particle assembly film was not provided.

Example 4-1

The same method as Example 3-1 was employed to provide on a 0.5 mm thick soda glass substrate the metal-based particle assembly film described in Example 3-1.

Then a solution for an $Alq_3$ light emitting layer was applied with spin-coating on the metal-based particle assembly film to form an $Alq_3$ light emitting layer having an average thickness of 30 nm. The solution for the $Alq_3$ light emitting layer was prepared by dissolving $Alq_3$ (Tris-(8-hydroxyquinoline) aluminum from Sigma Aldrich Co. LLC.) in chloroform to have a concentration of 0.5% by weight.

Example 4-2

The same method as Example 3-2 was employed to provide a metal-based particle assembly film having an insulating layer with an average thickness of 10 nm and thereafter the same method as Example 4-1 was employed to form an $Alq_3$ light emitting layer having an average thickness of 30 nm to obtain a light emitting device.

Example 4-3

A light emitting device was produced similarly as done in Example 4-2 except that the insulating layer had an average thickness of 30 nm.

Example 4-4

A light emitting device was produced similarly as done in Example 4-2 except that the insulating layer had an average thickness of 80 nm.

Example 4-5

A light emitting device was produced similarly as done in Example 4-2 except that the insulating layer had an average thickness of 150 nm.

Comparative Example 5-1

The same method as Comparative Example 3-1 was employed to provide on a 1 mm thick soda glass substrate the metal-based particle assembly film described in Comparative Example 3-1 and thereafter the same method as Example 4-1 was employed to form an $Alq_3$ light emitting layer having an average thickness of 30 nm to obtain a light emitting device.

Comparative Example 5-2

The same method as Comparative Example 3-2 was employed to provide a metal-based particle assembly film having an insulating layer with an average thickness of 10 nm and thereafter the same method as Example 4-1 was employed to form an $Alq_3$ light emitting layer having an average thickness of 30 nm to obtain a light emitting device.

Comparative Example 5-3

A light emitting device was produced similarly as done in Comparative Example 5-2 except that the insulating layer had an average thickness of 30 nm.

Comparative Example 5-4

A light emitting device was produced similarly as done in Comparative Example 5-2 except that the insulating layer had an average thickness of 80 nm.

Comparative Example 5-5

A light emitting device was produced similarly as done in Comparative Example 5-2 except that the insulating layer had an average thickness of 150 nm.

Comparative Example 6

A light emitting device was produced similarly as done in Example 4-1 except that the metal-based particle assembly film was not provided.

Example 5-1

The same method as Example 3-1 was employed to provide on a 0.5 mm thick soda glass substrate the metal-based particle assembly film described in Example 3-1.

Then a solution for an F8BT light emitting layer was applied with spin-coating on the metal-based particle assembly film and subsequently annealed with a hot plate at 170° C. for 30 minutes to form an F8BT light emitting layer having an average thickness of 30 nm. The solution for the F8BT light emitting layer was prepared by dissolving F8BT (from Luminescence Technology Corp.) in chlorobenzene to have a concentration of 1% by weight.

Example 5-2

The same method as Example 3-2 was employed to provide a metal-based particle assembly film having an insulating layer with an average thickness of 10 nm and thereafter the same method as Example 5-1 was employed to form an F8BT light emitting layer having an average thickness of 30 nm to obtain a light emitting device.

Example 5-3

A light emitting device was produced similarly as done in Example 5-2 except that the insulating layer had an average thickness of 30 nm.

Comparative Example 7-1

The same method as Comparative Example 3-1 was employed to provide on a 1 mm thick soda glass substrate the metal-based particle assembly film described in Comparative Example 3-1 and thereafter the same method as Example 5-1 was employed to form an F8BT light emitting layer having an average thickness of 30 nm to obtain a light emitting device.

Comparative Example 7-2

The same method as Comparative Example 3-2 was employed to provide a metal-based particle assembly film-layered substrate having an insulating layer with an average thickness of 10 nm and thereafter the same method as Example 5-1 was employed to form an F8BT light emitting layer having an average thickness of 30 nm to obtain a light emitting device.

Comparative Example 7-3

A light emitting device was produced similarly as done in Comparative Example 7-2 except that the insulating layer had an average thickness of 30 nm.

Comparative Example 8

A light emitting device was produced similarly as done in Example 5-1 except that the metal-based particle assembly film was not provided.

Comparative Example 9-1

On a 1 mm thick soda glass substrate a 13 nm thick, thin conductive silver film was deposited through vacuum deposition. The vapor deposition was done in a chamber having an internal pressure set at $3 \times 10^{-3}$ Pa. Then the substrate with the thin conductive silver film deposited thereon was annealed in an electric furnace of 400° C. for 10 minutes to obtain a metal-based particle assembly film-layered substrate.

Figure 10:
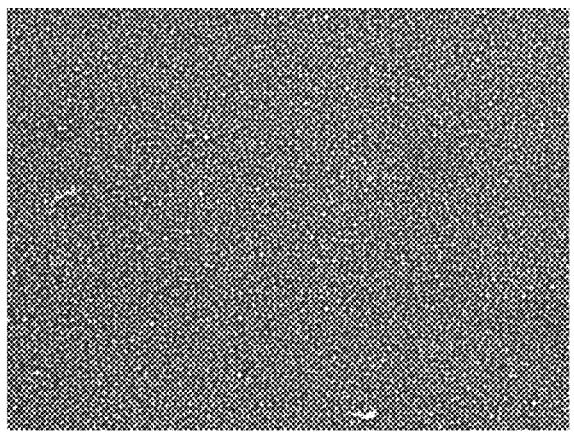
FIG. 10 shows SEM images (as scaled 10000 times and 50000 times) of a metal-based particle assembly film in a metal-based particle assembly film-layered substrate obtained in Comparative Example 9-1, as observed from directly above.
Figure 10:
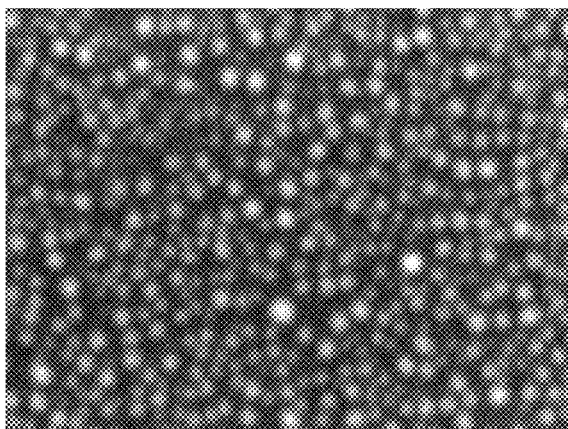
Figure 11:
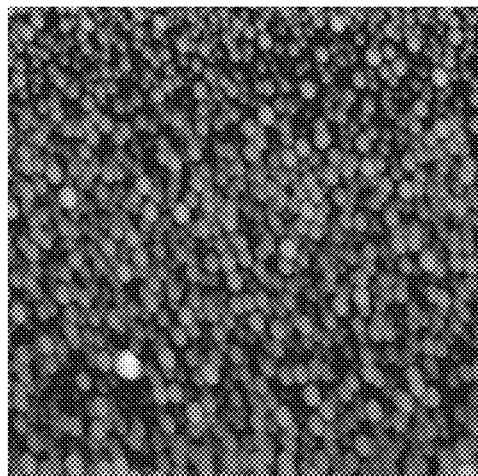
FIG. 11 shows an AFM image of the metal-based particle assembly film in the metal-based particle assembly film-layered substrate obtained in Comparative Example 9-1.

FIG. 10 shows SEM images of a metal-based particle assembly film in the obtained metal-based particle assembly film-layered substrate, as observed from directly above. FIG. 10(a) shows an image enlarged as scaled 10000 times and FIG. 10(b) shows an image enlarged as scaled 50000 times. FIG. 11 shows an AFM image of the metal-based particle assembly film in the metal-based particle assembly film-layered substrate obtained in Comparative Example 9-1. FIG. 11 shows an image having a size of 5 μm×5 μm.

A calculation with reference to the FIG. 10 SEM images indicates that Comparative Example 9-1 provided a metal-based particle assembly configured of silver particles having an average particle diameter of 95 nm and an average interparticle distance of 35.2 nm, based on the definition indicated above. Furthermore, from the FIG. 11 AFM image, an average height of 29.6 nm was obtained. From these values, the silver particle's aspect ratio (average particle diameter/average height) is calculated to be 3.20.

Figure 12:
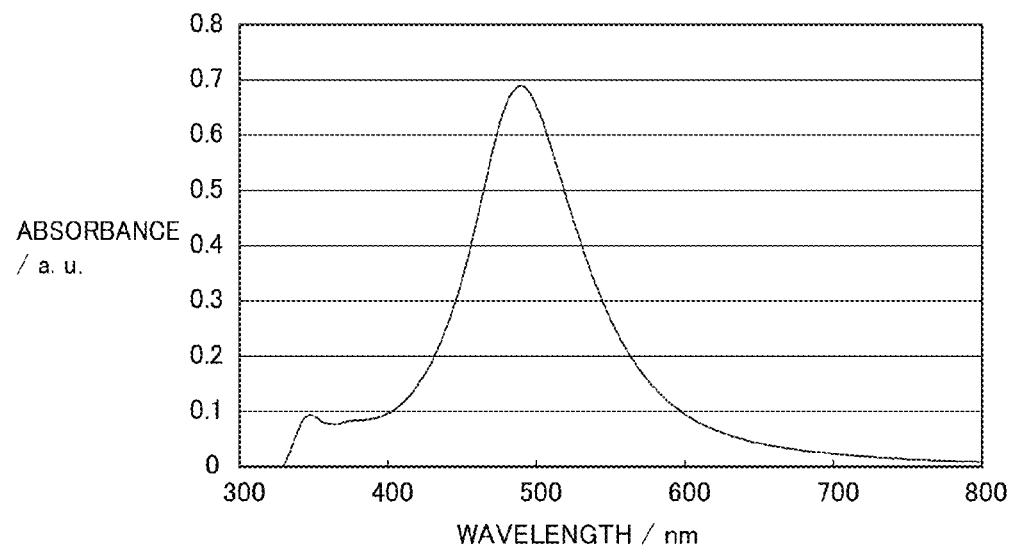
FIG. 12 represents an absorption spectrum of the metal-based particle assembly film-layered substrate obtained in Comparative Example 9-1.

FIG. 12 shows an absorption spectrum of the metal-based particle assembly film-layered substrate obtained in Comparative Example 9-1, as measured as described above. Comparative Example 9-1 presents in an absorption spectrum a peak wavelength (a maximum wavelength of a plasmon peak at a longest side in wavelength) located at a side longer in wavelength than that of the absorption spectrum of Example 3-1 shown in FIG. 9, and also has low absorbance at the peak wavelength.

Then the same method as Example 4-1 was employed to form an $Alq_3$ light emitting layer having an average thickness of 30 nm to obtain a light emitting device.

Comparative Example 9-2

The same method as Comparative Example 9-1 was employed to provide on a 1 mm thick soda glass substrate the metal-based particle assembly film described in Comparative Example 9-1. Thereafter immediately a SOG solution was applied with spin-coating on the metal-based particle assembly film to have an insulating layer having an average thickness of 10 nm layered thereon. For the SOG solution was used "OCD T-7 5500T", an organic SOG material produced by TOKYO OHKA KOGYO CO., LTD., which was then diluted with ethanol. Then the same method as Example 4-1 was employed to form an $Alq_3$ light emitting layer having an average thickness of 30 nm to obtain a light emitting device.

Comparative Example 9-3

A light emitting device was produced similarly as done in Comparative Example 9-2 except that the insulating layer had an average thickness of 30 nm.

Comparative Example 9-4

A light emitting device was produced similarly as done in Comparative Example 9-2 except that the insulating layer had an average thickness of 80 nm.

Comparative Example 9-5

A light emitting device was produced similarly as done in Comparative Example 9-2 except that the insulating layer had an average thickness of 150 nm.

Figure 13:
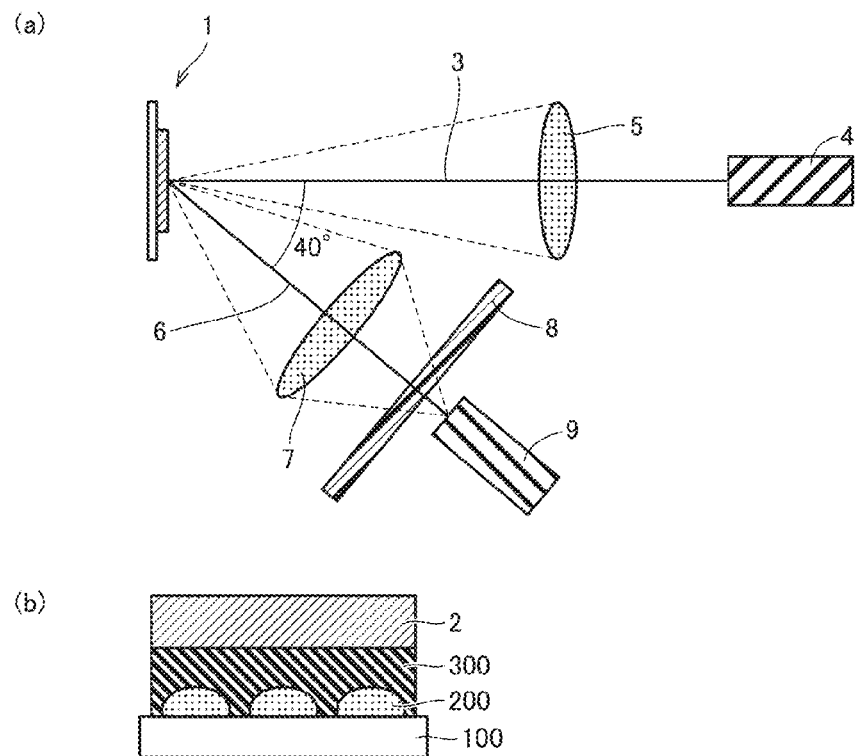
FIG. 13(a) schematically shows a system to measure an emission spectrum of a photoexcited light emitting device.
FIG. 13(b) is a schematic cross section view of a photoexcited light emitting device having a metal-based particle assembly film and an insulating layer.

Photoexcited light emitting devices of Examples 3-1, 3-2, 3-3, 3-4, 3-5, 3-6, Examples 4-1, 4-2, 4-3, 4-4, 4-5, Examples 5-1, 5-2, 5-3, Comparative Examples 3-1, 3-2, 3-3, 3-4, 3-5, 3-6, Comparative Example 4, Comparative Examples 5-1, 5-2, 5-3, 5-4, 5-5, Comparative Example 6, Comparative Examples 7-1, 7-2, 7-3, Comparative Example 8, Comparative Examples 9-1, 9-2, 9-3, 9-4, 9-5 were assessed for emission enhancement in level, as follows. With reference to FIG. 13(a) showing a system employed to measure the photoexcited light emitting devices' emission spectra and FIG. 13(b) showing a schematic cross section view of a photoexcited light emitting device, a light emitting layer 2 side of a photoexcited light emitting device 1 was exposed to excitation light 3 from a direction perpendicular to a surface of light emitting layer 2 to cause photoexcited light emitting device 1 to emit light. For an excitation light source 4 was used a UV-LED (UV-LED375-nano produced by SOUTH WALKER, excitation light wavelength: 375 nm). Radiated was excitation light 3 obtained by condensing the light emitted from excitation light source 4 through a lens 5. An emitted light 6 from photoexcited light emitting device 1 in a direction of 40 degrees relative to the optical axis of excitation light 3 was condensed by a lens 7 and then transmitted through a wavelength cut-off filter 8 (SCF-50S-44Y produced by SIGMA KOKI Co., LTD) to cut the light of the wavelength of the excitation light and then detected via a spectrophotometer 9 (MCPD-3000 produced by Otsuka Electronics Co., Ltd.). FIG. 13(b) is a schematic cross section view of photoexcited light emitting device 1 including on soda glass substrate 100 a metal-based particle assembly film 200, an insulating layer 300, and light emitting layer 2 provided in this order, as produced in the examples and comparative examples.

Figure 14:
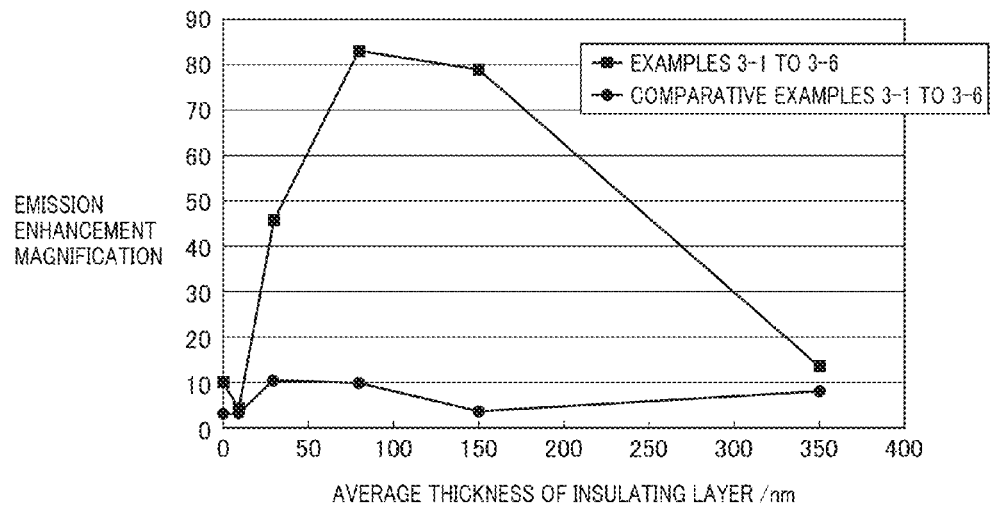
FIG. 14 compares emission enhancement effects in photoexcited light emitting devices of Examples 3-1 to 3-6 with emission enhancement effects in photoexcited light emitting devices of Comparative Examples 3-1 to 3-6.

From the spectra of the emissions detected, integrals were obtained for the emission wavelength ranges. The respective integrals obtained from each emission spectrum of the photoexcited light emitting devices of Examples 3-1, 3-2, 3-3, 3-4, 3-5, 3-6 and Comparative Examples 3-1, 3-2, 3-3, 3-4, 3-5, 3-6 were divided by the integral obtained from an emission spectrum of the photoexcited light emitting device of Comparative Example 4 to obtain "emission enhancement magnification", as represented in FIG. 14 along the axis of ordinate.

Figure 15:
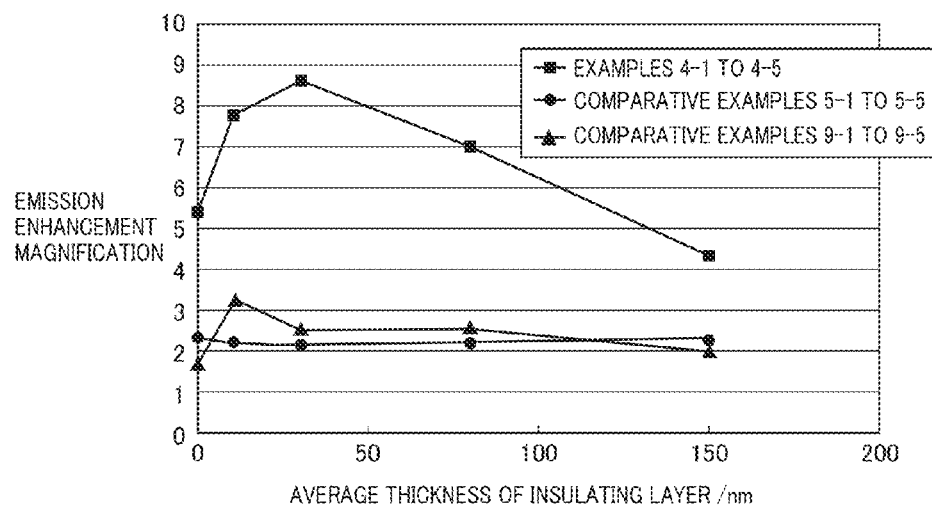
FIG. 15 compares emission enhancement effects in photoexcited light emitting devices of Examples 4-1 to 4-5 with emission enhancement effects in photoexcited light emitting devices of Comparative Examples 5-1 to 5-5 and 9-1 to 9-5.

The respective integrals obtained from each emission spectrum of the photoexcited light emitting devices of Examples 4-1, 4-2, 4-3, 4-4, 4-5, Comparative Examples 5-1, 5-2, 5-3, 5-4, 5-5 and Comparative Examples 9-1, 9-2, 9-3, 9-4, 9-5 were divided by the integral obtained from an emission spectrum of the photoexcited light emitting device of Comparative Example 6 to obtain "emission enhancement magnification", as represented in FIG. 15 along the axis of ordinate.

Figure 16:
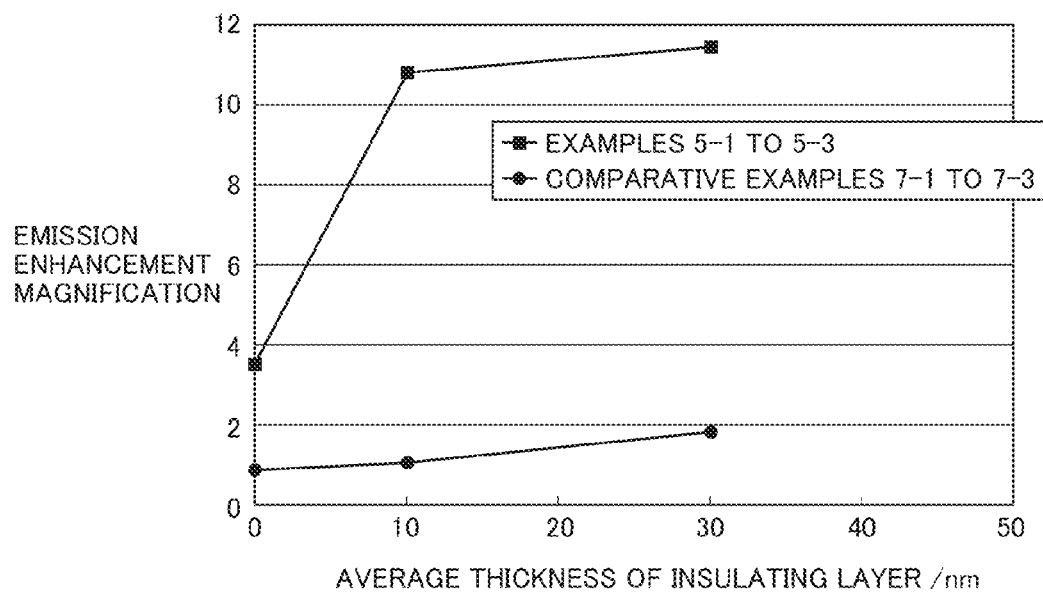
FIG. 16 compares emission enhancement effects in photoexcited light emitting devices of Examples 5-1 to 5-3 with emission enhancement effects in photoexcited light emitting devices of Comparative Examples 7-1 to 7-3.

The respective integrals obtained from each emission spectrum of the photoexcited light emitting devices of Examples 5-1, 5-2, 5-3 and Comparative Examples 7-1, 7-2, 7-3 were divided by the integral obtained from an emission spectrum of the photoexcited light emitting device of Comparative Example 8 to obtain "emission enhancement magnification", as represented in FIG. 16 along the axis of ordinate.

[Producing Organic EL Device and Assessing Emission Intensity]

Example 6

Silver particles were grown under the same conditions as Example 1 to provide on a 0.5 mm thick soda glass substrate the metal-based particle assembly film described in Example 1. Thereafter immediately a spin-on glass (SOG) solution was applied with spin-coating on the metal-based particle assembly film to have an insulating layer having an average thickness of 80 nm layered thereon. For the SOG solution was used "OCD T-7 5500T", an organic SOG material produced by TOKYO OHKA KOGYO CO., LTD., which was then diluted with ethanol.

Then ion sputtering was employed to layer an anode electrode that is an IZO layer (thickness: 22 nm) on the insulating layer and thereafter a hole injection layer forming solution was applied with spin-coating on the anode electrode to layer a hole injection layer having an average thickness of 20 nm. For the hole injection layer forming solution was used a product of PLEXTRONICS Inc. having a product name "Plexcore AQ 1200" which was then diluted with ethanol to have a prescribed concentration. The insulating layer, the anode electrode, and the hole injection layer have a total average thickness of 122 nm (i.e., an average distance from a surface of the metal-based particle assembly film to the light emitting layer is 122 nm).

Subsequently, a polymeric luminophor soluble in an organic solvent was dissolved in the organic solvent at a prescribed concentration, and this solution was applied with spin-coating on the hole injection layer to provide a 100 nm thick light emitting layer. Then, vacuum deposition was employed to deposit an electron injection layer that is a NaF layer (of 2 nm thick), a cathode electrode that is an Mg layer (of 2 nm thick) and an Ag layer (of 10 nm thick) in that order on the light emitting layer. The obtained device had a front surface sealed with a sealant ("XNR5516ZLV", a UV curable resin produced by Nagase Chemtex Corp.) to obtain an organic EL device.

Comparative Example 10

An organic EL device was produced similarly as done in Example 6 except that the metal-based particle assembly film was not provided.

A source meter (a source meter type 2602A produced by Keithley Instruments Inc.) was used to apply a voltage of 15 V to the organic EL device of Example 6 constantly to cause the device to emit light with a current having a value of 2.3 mA passing between the electrodes. The emission spectrum was measured with "CS-2000", a spectrometric device produced by Konica Minolta Co., Ltd., and the obtained emission spectrum was integrated for a visible light wavelength range to obtain emission intensity. The emission intensity of the organic EL device of Comparative Example 10 was also obtained, similarly as done for the organic EL device of Example 6 (the same voltage of 15 V as the organic EL device of Example 6 was applied), except that a current having a value of 2.7 mA was passed between the electrodes. It has been confirmed that the resulting organic EL device of Example 6 exhibits an emission intensity approximately 3.8 times that of the organic EL device of Comparative Example 10.

Example 7

Silver particles were grown under the same conditions as Example 1 to provide on a 0.5 mm thick soda glass substrate the metal-based particle assembly film described in Example 1. Thereafter immediately a spin-on glass (SOG) solution was applied with spin-coating on the metal-based particle assembly film to have an insulating layer having an average thickness of 30 nm layered thereon. For the SOG solution was used "OCD T-7 5500T", an organic SOG material produced by TOKYO OHK A KOGYO CO., LTD., which was then diluted with ethanol.

Then ion sputtering was employed to layer an anode electrode that is an IZO layer (thickness: 22 nm) on the insulating layer and thereafter a hole injection layer forming solution was applied with spin-coating on the anode electrode to layer a hole injection layer having an average thickness of 20 nm. For the hole injection layer forming solution was used a product of PLEXTRONICS Inc. having a product name "Plexcore AQ 1200" which was then diluted with ethanol to have a prescribed concentration. The insulating layer, the anode electrode, and the hole injection layer have a total average thickness of 72 nm (i.e., an average distance from a surface of the metal-based particle assembly film to the light emitting layer is 72 nm).

Subsequently, vacuum deposition was employed to deposit on the hole injection layer a light emitting layer that is $Alq_3$ of 80 nm. Then, vacuum deposition was employed to deposit an electron injection layer that is a NaF layer (of 2 nm thick), a cathode electrode that is an Mg layer (of 2 nm thick) and an Ag layer (of 10 nm thick) in that order on the light emitting layer. The obtained device had a front surface sealed with a sealant ("XNR5516ZLV", a UV curable resin produced by Nagase Chemtex Corp.) to obtain an organic EL device.

Comparative Example 11

An organic EL device was produced similarly as done in Example 7 except that the metal-based particle assembly film was not provided.

A source meter (a source meter type 2602A produced by Keithley Instruments Inc.) was used to apply a voltage of 11 V to the organic EL device of Example 7 constantly to cause the device to emit light with a current having a value of 0.7 mA passing between the electrodes. The emission spectrum was measured with "CS-2000", a spectrometric device produced by Konica Minolta Co., Ltd., and the obtained emission spectrum was integrated for a visible light wavelength range to obtain emission intensity. The emission intensity of the organic EL device of Comparative Example 11 was also obtained, similarly as done for the organic EL device of Example 7 (the same voltage of 11 V as the organic EL device of Example 7 was applied), except that a current passed between the electrodes was adjusted to have a value of 1.1 mA. It has been confirmed that the resulting organic EL device of Example 7 exhibits an emission intensity approximately 2.6 times that of the organic EL device of Comparative Example 11.

REFERENCE SIGNS LIST

1: photoexcited light emitting device, 2: light emitting layer, 3: excitation light, 4: excitation light source, 5, 7: lens, 6: emitted light from photoexcited light emitting device, 8: wavelength cut-off filter, 9: spectrophotometer, 100: soda glass substrate, 200: metal-based particle assembly film, 300: insulating layer.

The invention claimed is:

1. A metal-based particle assembly film-layered substrate comprising: a substrate; and a film composed of a metal-based particle assembly layered on said substrate, the metal-based particle assembly comprising 17500 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, wherein said metal-based particles are disposed such that an average distance between adjacent metal-based particles is in a range of from 1 to 150 nm, and wherein the metal-based particle assembly film-layered substrate having in an absorption spectrum for a visible light region a maximum wavelength of a peak at a longest side in wavelength, the maximum wavelength being in a range of from 350 to 550 nm, and the substrate is formed of at least one material selected from the group consisting of an inorganic insulating material selected from $SiO_2$ and $ZrO_2$ and a plastic material.

2. The metal-based particle assembly film-layered substrate according to claim 1, wherein said metal-based particles are oblate particles with said aspect ratio of more than one.

3. The metal-based particle assembly film-layered substrate according to claim 1, wherein said metal-based particles are made of silver.

4. The metal-based particle assembly film-layered substrate according to claim 1, wherein said metal-based particles are non-conductive with adjacent metal-based particles.

5. The metal-based particle assembly film-layered substrate according to claim 1, wherein the absorbance at the maximum wavelength being at least one.

6. The metal-based particle assembly film-layered substrate according to claim 1, further comprising an insulating layer covering a surface of each metal-based particle that composes said film.

* * * * *